(12) United States Patent
Joseph

(10) Patent No.: US 11,557,879 B2
(45) Date of Patent: Jan. 17, 2023

(54) RIGID HIGH POWER AND HIGH SPEED LASING GRID STRUCTURES

(71) Applicant: OptiPulse Inc., Albuquerque, NM (US)

(72) Inventor: John Richard Joseph, Albuquerque, NM (US)

(73) Assignee: OptiPulse Inc., Albuquerque, NM (US)

( * ) Notice: Subject to any disclaimer, the term of this patent is extended or adjusted under 35 U.S.C. 154(b) by 46 days.

(21) Appl. No.: 17/156,193

(22) Filed: Jan. 22, 2021

(65) Prior Publication Data

US 2021/0218228 A1 Jul. 15, 2021

Related U.S. Application Data

(63) Continuation of application No. 16/699,897, filed on Dec. 2, 2019, now Pat. No. 10,903,622, which is a continuation of application No. 16/215,069, filed on Dec. 10, 2018, now Pat. No. 10,498,106, which is a
(Continued)

(51) Int. Cl.
| | |
|---|---|
| *H01S 5/183* | (2006.01) |
| *H01S 5/42* | (2006.01) |
| *H01S 5/042* | (2006.01) |
| *H01S 5/20* | (2006.01) |

(52) U.S. Cl.
CPC ...... *H01S 5/18341* (2013.01); *H01S 5/04257* (2019.08); *H01S 5/18308* (2013.01); *H01S 5/423* (2013.01); *H01S 5/0425* (2013.01); *H01S 5/04256* (2019.08); *H01S 5/18388* (2013.01); *H01S 5/2063* (2013.01)

(58) Field of Classification Search
CPC ..... H01S 5/0425; H01S 5/18341; H01S 5/423
See application file for complete search history.

(56) References Cited

U.S. PATENT DOCUMENTS

| | | |
|---|---|---|
| 5,793,880 A | 8/1998 | Constant |
| 5,896,408 A | 4/1999 | Corzine et al. |
| 5,978,408 A | 11/1999 | Thornton |
| (Continued) | | |

FOREIGN PATENT DOCUMENTS

| | | |
|---|---|---|
| CN | 1360376 A | 7/2002 |
| CN | 1732604 A | 2/2006 |
| (Continued) | | |

OTHER PUBLICATIONS

Mutig et al., "Modulation Characteristics of High-Speed and High-Temperature Stable 980 nm Range VCSELs Operating Error Free at 25 Gbit/s up to 85° C.", IEEE Journal of Selected Topics in Quantum Electronics, Nov.-Dec. 2011, pp. 1568-1575, vol. 17, No. 6.

(Continued)

*Primary Examiner* — Michael Carter
(74) *Attorney, Agent, or Firm* — Thompson Coburn LLP

(57) ABSTRACT

Disclosed herein are various embodiments for stronger and more powerful high speed laser arrays. For example, an apparatus is disclosed that comprises an active mesa structure in combination with an electrical waveguide, wherein the active mesa structure comprises a plurality of laser regions within the active mesa structure itself, each laser region of the active mesa structure being electrically isolated within the active mesa structure itself relative to the other laser regions of the active mesa structure.

20 Claims, 18 Drawing Sheets

Related U.S. Application Data continuation of application No. 15/223,712, filed on Jul. 29, 2016, now Pat. No. 10,153,615.

(60) Provisional application No. 62/272,242, filed on Dec. 29, 2015, provisional application No. 62/199,117, filed on Jul. 30, 2015.

(56) References Cited

U.S. PATENT DOCUMENTS

| | | | |
|---|---|---|---|
| 6,016,212 | A | 1/2000 | Durant et al. |
| 6,347,001 | B1 | 2/2002 | Arnold et al. |
| 6,493,368 | B1 | 12/2002 | Chirovsky et al. |
| 6,645,848 | B2 | 11/2003 | Joseph et al. |
| 7,526,206 | B1 | 4/2009 | Rolenz |
| 7,949,024 | B2 | 5/2011 | Joseph |
| 8,076,693 | B2 | 12/2011 | Shi |
| 8,520,713 | B2 | 8/2013 | Joseph |
| 8,613,536 | B2 | 12/2013 | Joseph et al. |
| 8,848,757 | B2 | 9/2014 | Joseph |
| 8,979,338 | B2 | 3/2015 | Joseph |
| 8,995,485 | B2 | 3/2015 | Joseph et al. |
| 8,995,493 | B2 | 3/2015 | Joseph et al. |
| 9,065,239 | B2 | 6/2015 | Joseph et al. |
| 9,599,667 | B1 | 3/2017 | Beutler et al. |
| 9,887,515 | B2 | 2/2018 | Furuya |
| 9,927,558 | B2 | 3/2018 | Carson et al. |
| 9,998,221 | B2 | 6/2018 | Boroson et al. |
| 10,038,304 | B2 | 7/2018 | Joseph |
| 10,153,615 | B2 | 12/2018 | Joseph |
| 10,374,705 | B2 | 8/2019 | Joseph |
| 10,493,106 | B2 | 12/2019 | Wang et al. |
| 10,498,106 | B2 * | 12/2019 | Joseph .................... H01S 5/423 |
| 10,868,616 | B2 | 12/2020 | Joseph |
| 10,903,622 | B2 * | 1/2021 | Joseph ................ H01S 5/18308 |
| 10,958,350 | B2 | 3/2021 | Joseph et al. |
| 2002/0182848 | A1 | 12/2002 | Joseph et al. |
| 2003/0026303 | A1 | 2/2003 | Ouchi |
| 2003/0091084 | A1 | 5/2003 | Sun et al. |
| 2004/0067006 | A1 | 4/2004 | Welch et al. |
| 2004/0090620 | A1 | 5/2004 | Farr |
| 2004/0141753 | A1 | 7/2004 | Andreu-von Euw et al. |
| 2004/0190580 | A1 | 9/2004 | Pezeshki et al. |
| 2005/0100070 | A1 | 5/2005 | Nakayama et al. |
| 2006/0023757 | A1 | 2/2006 | Mooradian et al. |
| 2007/0091960 | A1 | 4/2007 | Gauggel et al. |
| 2007/0217473 | A1 | 9/2007 | Abe et al. |
| 2007/0280320 | A1 | 12/2007 | Feezell et al. |
| 2010/0158067 | A1 | 6/2010 | Nakatsuka et al. |
| 2010/0303113 | A1 | 12/2010 | Joseph |
| 2011/0013911 | A1 | 1/2011 | Alexander et al. |
| 2011/0148328 | A1 | 6/2011 | Joseph et al. |
| 2011/0176567 | A1 * | 7/2011 | Joseph .................... H01S 5/423 372/36 |
| 2011/0279903 | A1 | 11/2011 | Wiedemann et al. |
| 2012/0128015 | A1 | 5/2012 | Joseph |
| 2013/0027778 | A1 | 1/2013 | Currie et al. |
| 2013/0223466 | A1 | 8/2013 | Gronenbom et al. |
| 2013/0223846 | A1 | 8/2013 | Joseph et al. |
| 2013/0266326 | A1 | 10/2013 | Joseph et al. |
| 2013/0272330 | A1 | 10/2013 | Joseph et al. |
| 2014/0079088 | A1 | 3/2014 | Joseph |
| 2014/0105553 | A1 | 4/2014 | Kim et al. |
| 2014/0161466 | A1 | 6/2014 | Riza |
| 2014/0199542 | A1 | 7/2014 | Li et al. |
| 2015/0063387 | A1 | 3/2015 | Joseph et al. |
| 2015/0171375 | A1 | 6/2015 | Setz |
| 2015/0321621 | A1 | 11/2015 | Van Dan Elzen et al. |
| 2015/0340841 | A1 | 11/2015 | Joseph |
| 2016/0020855 | A1 | 1/2016 | Guetta |
| 2016/0080077 | A1 | 3/2016 | Joseph et al. |
| 2016/0164261 | A1 | 6/2016 | Warren |
| 2016/0170218 | A1 | 6/2016 | Johnson et al. |
| 2017/0033535 | A1 | 2/2017 | Joseph |
| 2017/0115497 | A1 | 4/2017 | Chen et al. |
| 2017/0299781 | A1 | 10/2017 | Carson et al. |
| 2017/0310072 | A1 | 10/2017 | Link et al. |
| 2018/0172885 | A1 | 6/2018 | Carson et al. |
| 2018/0366907 | A1 | 12/2018 | Joseph |
| 2019/0006819 | A1 | 1/2019 | Joseph |

FOREIGN PATENT DOCUMENTS

| | | |
|---|---|---|
| CN | 102263371 A | 11/2011 |
| CN | 103403986 A | 11/2013 |
| CN | 103633559 A | 3/2014 |
| DE | 69830463 T2 | 3/2006 |
| EP | 0898344 A2 | 2/1999 |
| EP | 1501162 A2 | 1/2005 |
| EP | 3000157 A1 | 3/2016 |
| JP | 2001083460 A | 3/2001 |
| JP | 2016040822 A | 3/2016 |
| JP | 2016519436 A | 6/2016 |
| WO | 2014018684 A1 | 1/2014 |
| WO | 2014175901 A1 | 10/2014 |

OTHER PUBLICATIONS

Prosecution History for U.S. Appl. No. 16/699,897, now U.S. Pat. No. 10,903,622, filed Dec. 2, 2019.

Extended European Search Report for EP Application 16831439.1 dated Mar. 2, 2019.

International Search Report and Written Opinion for PCT/US2016/044813 dated Oct. 18, 2016.

International Search Report and Written Opinion for PCT/US2018/046556 dated Oct. 18, 2018.

Kong et al., "Graphene based Ultra-Thin Flat Lenses", ACS Photonics, 2015, 19 pages.

Prosecution History for U.S. Appl. No. 15/223,712, now U.S. Pat. No. 10,153,615, filed Jul. 29, 2016.

Prosecution History for U.S. Appl. No. 16/123,914, filed Sep. 6, 2018.

Prosecution History for U.S. Appl. No. 16/215,069, now U.S. Pat. No. 10,498,106, filed Dec. 10, 2018.

Yoshikawa et al., "High Power VCSEL Devices for Free Space Optical Communications", Proc. of Electronic Components and Technology Conference, 2005, pp. 1353-1358, vol. 2.

Aiki et al., "High-Speed Integrated Optical Repeater Design Method", Transactions of the IECE of Japan, Feb. 1986, pp. 113-123, vol. E69, No. 2.

Carson et al., "Progress in High-Power, High-Speed VCSEL Arrays", Proceedings of the SPIE, Mar. 2016, 14 pp., vol. 9766.

* cited by examiner

RIGID HIGH POWER AND HIGH SPEED LASING GRID STRUCTURES

CROSS REFERENCE AND PRIORITY CLAIM TO RELATED PATENT APPLICATIONS

This patent application is a continuation of U.S. patent application Ser. No. 16/699,897, filed Dec. 2, 2019, now U.S. Pat. No. 10,903,622, which is a continuation of U.S. patent application Ser. No. 16/215,069, filed Dec. 10, 2018, now U.S. Pat. No. 10,498,106, which is a continuation of U.S. patent application Ser. No. 15/223,712, filed Jul. 29, 2016, now U.S. Pat. No. 10,153,615, which claims priority to (1) U.S. provisional patent application Ser. No. 62/199,117, filed Jul. 30, 2015, and (2) U.S. provisional patent application Ser. No. 62/272,242, filed Dec. 29, 2015, the entire disclosures of each of which are incorporated herein by reference.

INTRODUCTION

Laser arrays are becoming important in the field of communications, light detection and ranging (LiDaR), and materials processing because of their higher operational optical power and high frequency operation as compared to single lasers, fiber lasers, diode pumped solid state (DPSS) lasers, and light emitting diodes (LEDs).

Laser arrays are commonly used in printing and communications, but in configurations which have a single separate connection to each laser device in the array for parallel communication where each laser could have a separate signal because it had a separate contact from the other devices in the array.

When array elements were tied together and driven with a single signal, the structures had too much capacitance or inductance. This high capacitance/inductance characteristic slowed the frequency response for the laser array down, thereby making such laser arrays slower as they added more elements. This is evidenced in the referenced works by Yoshikawa et al., "High Power VCSEL Devices for Free Space Optical Communications", Proc. of Electronic Components and Technology Conference, 2005, pp. 1353-58 Vol. 2, and U.S. Pat. No. 5,978,408.

High speed laser arrays based on multi-mesa structures are described in the inventor's previous work, US Pat App. Pub. 2011/0176567. US Pat App. Pub. 2011/0176567 describes a multi-mesa array of semiconductor lasers and their connections to a high speed electrical waveguide for high frequency operation. However, the multi-mesa structures described in US Pat App. Pub. 2011/0176567 suffers from a number of shortcomings.

One problem with mesa structures as described in US Pat App. Pub. 2011/0176567 is they are typically brittle. This is a problem if there is any mechanical procedure to bond to or touch the laser after the mesa is formed. The mesas structures can be as small as 5 to 10 microns in diameter and consist of an extremely fragile material such as GaAs or AlGas, or other similar crystalline materials. These mesas must be bonded after processing and pressure is applied under heat so that the submount and the tops of the laser mesas are bonded electrically with solder. When bonding an array of back emitting devices a typical failure mechanism at bonding is a cracked mesa which renders the laser useless and can cause a rejection of the entire device. If there are 30 lasers on the chip and after bonding 2 are broken, those 2 devices will not light up. The testing still must be done causing an expensive process to remove failures.

Another problem is that the multi-mesa structure yields relatively low lasing power as a function of chip real estate because of spacing requirements for the multiple mesas that are present on the laser chip.

Another problem with the multiple mesa arrays produced by mesa isolation is that the lasers are separated by a distance which limits the overall size of the array due to frequency response-dependent design parameters that prefer shorter distance for a signal to travel across a contact pad. Later, arrays were used with elements which add in power such as the multi Vertical Cavity Surface Emitting Laser (VCSEL) arrays which were used for infrared (IR) illumination. However these IR sources did not support high frequency operation, so their pulse width was limited to illumination instead of LIDAR, which needs fast pulse widths.

In an effort to satisfy needs in the art for stronger and more powerful high speed laser arrays, the inventor discloses a number of inventive embodiments herein. For example, embodiments of the invention described below incorporate a high frequency electrical waveguide to connect lasers of the array together while reducing capacitance by forming the signal pad on the substrate which employs the electrical waveguide. Embodiments of the invention also comprise the use of multi-conductive current confinement techniques in a single structure to produce multiple areas that are conducting compared to non-conducting part of the structures. The conducting parts form lasing areas or grids of lasing forming lasers without etching around the entire structure of the lasing point. Unlike the design described in the above-referenced U.S. Pat. No. 5,978,408, embodiments of the invention disclosed herein are designed and processed so that the laser array is integrated with a high speed electrical waveguide to enable high frequency operation. Embodiments of the present invention support new and unique opportunities in the design of a high power high speed light sources by exhibiting both high frequency operation and a rigid structure, thus enhancing performance and reliability over other designs known in the art.

In an example embodiment disclosed herein, a unique structure processed from a Vertical Cavity Surface Emitting Laser (VCSEL) epitaxial material forms a grid of laser points from a single rigid structure which is conducive to high speed operation by reducing capacitance, increasing structural integrity, and decreasing the fill factor as compared to the typical mesa structures formed in VCSEL arrays such as those mentioned in US Pat App. Pub. 2011/0176567. It should be understood that the VCSEL embodiment is only an example, and such a design can work with other laser types, such as Resonant Cavity Light Emitting Diodes (RCLEDs), LEDs, or Vertical Extended (or External) Cavity Surface Emitting Lasers (VECSELs).

The single contiguous structure described herein forms areas of electrical isolation of apertures using implanting of ions or areas of nonconductive oxidation through microstructures or holes while keeping the structural integrity of the material that is typically etched away. The formation of the new structure also allows a high speed signal to be distributed between the different isolated laser conduction points or grid. All of the P-contact areas of the laser grid can be connected in parallel to the signal portion of a ground-signal-ground (GSG) integrated electrical waveguide. The signal or current being switched on and off in the waveguide is distributed between all of the conductive paths which form lasers. It should be understood that other types of electrical waveguides could be used such as a micro-strip waveguide.

The single contiguous structure has other benefits such as a larger base for heat distribution within a larger plating structure. The lasing grid is closer together than the array structures to each other. The farther the lasers are apart the slower the frequency response or the speed which limits the ultimate bandwidth of the device due to the distance the signal must travel to every single point in an array.

Accordingly, examples of advantages that arise from embodiments of the invention include:

1. Rigid structure has a higher reliability in the chip bonding process
2. Rigid structure has a higher fill factor possibility
3. Rigid structure has higher reliability metal contacts
4. Rigid structure is simpler to process
5. Rigid structure has shorter distance between contacts enabling higher frequency high power beams
6. Rigid structure is a better surface topology for a single lens or lens array to be attached
7. Rigid mesa structure produces another area for leads and contacts which offer separation from potentials lowering capacitance.
8. Rigid structures allow higher integration with sub mounts because of the 3D nature of the contacts.

Furthermore, with an example embodiment, a laser grid is formed by more than one lasing area enabled by confining the current to isolated regions in the structure where conductivity exists as compared to the nonconductive ion implanted areas. The conductive and nonconductive areas form a grid of light which has a single metal contact on the single solid structure for the active Positive contact and a single N Contact on the surrounding ground structure which is shorted to the N contact area at the bottom of the trench isolating the two areas. By way of example, FIG. 7E shows how an opening in the frame would help increase the speed.

These P and N contacts are then bonded to a high speed electrical contact The 2 substrate and laser chips are aligned by a bonder then heat and pressure are applied to bond the solder that has been deposited on one chip or the other. The high speed is enabled because the p pad is separated from the n wafer ground by plating and solder heights but mostly by removing it off the laser substrate and placing it on an electrical waveguide substrate. The physical separations dramatically reduces capacitance increasing the frequency response which is limited by the capacitance of the circuit. This enables the lasing grid to achieve high frequency operation.

A single lens formed on the back of the substrate or a single Lens attached or bonded to the back of the grid structure could direct each lasing point from a convergence point or to a convergence point. This is ideal in collimating the beam output as if it were from a single source.

These and other features and advantages of the present invention will be described hereinafter to those having ordinary skill in the art.

DETAILED DESCRIPTION OF EXAMPLE EMBODIMENTS

Embodiment 1—Top-Emitting Implant

Figure 1:
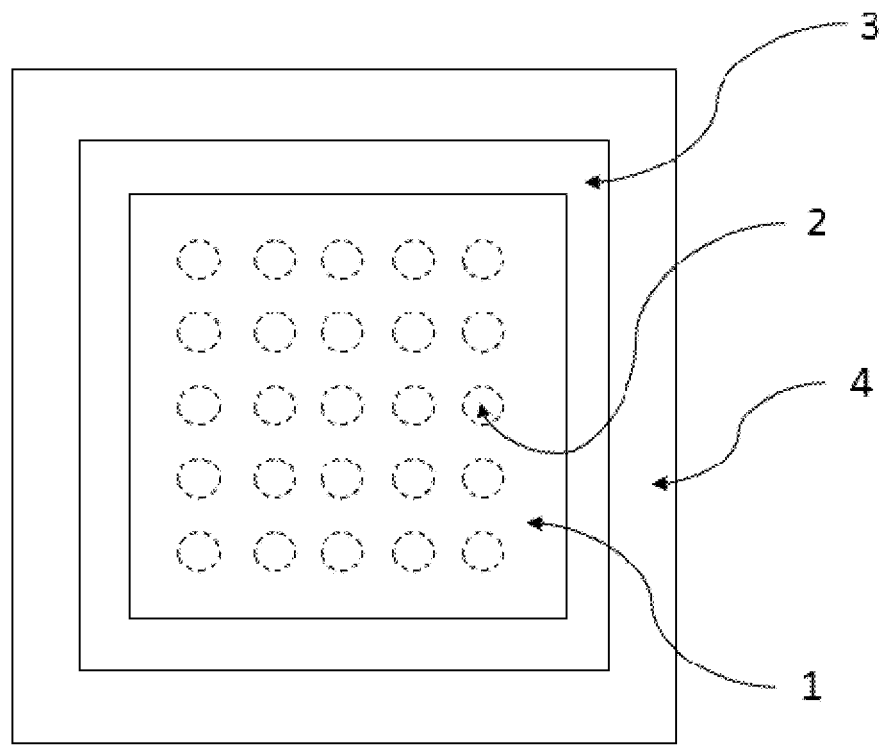
FIGS. 1-5 show various views of an example top-emitting implant embodiment.

FIG. 1 shows an example of a first embodiment of the invention. In this example, a single solid structure is isolated from a surrounding ground with an etch, and where the single solid structure has within it ion implants. The ion implants create areas of the semiconductor material that are non-conductive, and these areas of non-conductivity force current flow through the lasing areas 2. Thus, the ion implants form a laser grid of multiple lasing areas 2 where current is confined to isolated regions in the structure where conductivity exists as compared to the nonconductive ion-implanted areas. The conductive and nonconductive areas form a grid of light which has a single metal contact on the single solid structure for the active positive (P) contact and a single negative (N) contact on the surrounding ground structure which is shorted to the N contact area at the bottom of the trench isolating the two areas or to negative metal on the surrounding ground structure which is shorted to the N contact area at the bottom of the trench isolating the two areas (as in, for example, FIG. 7E (see reference numbers 781 and 782). These P and N contacts are then bonded to a high speed electrical contact, thereby enabling the lasing grid to achieve high frequency operation.

Figure 23:
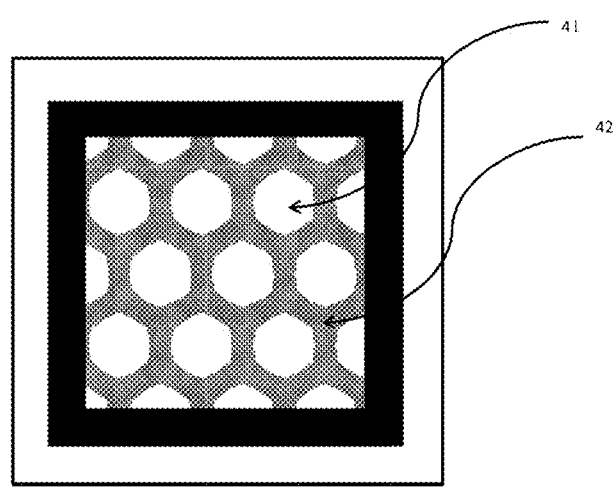
FIG. 23 shows an example of an additional pattern for a lasing grid with respect to various embodiments.

While FIG. 1 shows the lasing areas 2 arranged in a grid pattern, it should be understood that many shapes and patterns of lasing areas 2 could be formed. This allows many forms of structures with shapes/patterns of lasing areas 2 such as a honeycomb structure pattern (see, for example, FIG. 23 which illustrates another pattern which is one of many allowing different laser shapes or patterns; there are many patterns that can be used for etching or implanting to leave conductive areas 41 for lasers in a single mesa structure versus non-conductive areas 42) and other structure patterns which are more rigid while improving bonding. Heat removal can still be accomplished by depositing materials with high thermal conductivity materials in the holes that are etched into the single mesa structure to produce the multiple lasers (see, e.g., holes 7005 in FIG. 7A) which are closer to the junctions. Examples of additional structure patterns can include arrangements like squares or circles on lines, etc.

FIG. 1 shows a top view of the epitaxial side of a laser chip. A single laser-emitting epitaxial structure 1 has an ion-implanted area, all except the lasing areas 2 (which are shown as disks in FIG. 1) where the ion implant was masked. FIG. 1 thus represents the chip after implant, and etch. Relative to the prior design of US Pat App Pub 2011/0176567 which has multiple epitaxial mesas with each mesa corresponding to a single lasing region, the design of FIG. 1 shows a single contiguous structure 1 that does not have multiple mesas and can instead be characterized as a single mesa, where this single mesa includes multiple lasing regions 2. The illustration of FIG. 1 is meant to show the single mesa structure and not the electrical contacts. This structure 1 could be either bottom emitting or top emitting depending on the design and reflectance on the N mirror as compared to the P mirror.

Figure 2:
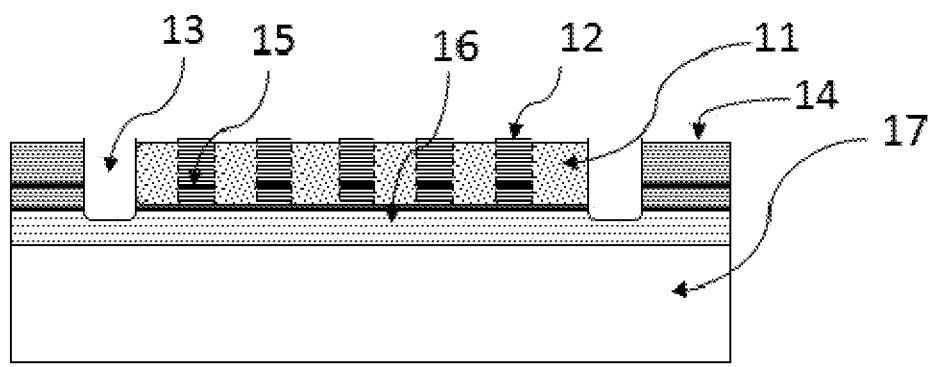

FIG. 1 shows:
1 Single Active Mesa Structure which will produce multiple lasing points
2 Areas where implant is masked so that implant does not affect epitaxial region under mask.
3 Etched isolation trench separating the Single Active Mesa Structure and the Single Ground Structure
4 Single Ground Structure FIG. 2 is a cutaway view of the laser chip shown by FIG. 1, where the single active mesa structure 1 shown by FIG. 1 is numbered as 11 in FIG. 2 and where the masked implant areas 2 shown by FIG. 1 are numbered as 12 in FIG. 2. FIG. 2 represents the chip after implant, and etch but no top metal. Etched region 13 isolates the single mesa structure 12 from the "frame" or N mesa 14 (where the single ground structure 4 from FIG. 1 is shown as the frame/N mesa 14 in FIG. 2).

Figure 3:
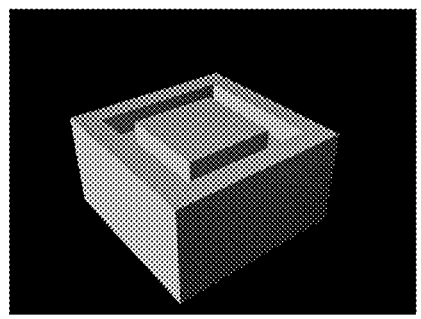

FIG. 2 shows:
11 Implanted area of Single Active Mesa Structure isolating multiple lasing points
12 Areas of the Epitaxy Masked from Implant which will produce lasing
13 Etched isolation trench separating the Single Active Mesa Structure 11 and the Single Ground Structure 14
14 Single Ground Structure
15 Quantum wells between the top P mirror and the bottom N mirror—this is an active region where Photons are emitted
16 N mirror which has N contact layer or highly doped layers for N metal electrical contact location
17 Laser substrate FIG. 3 is a perspective view of the chip shown by FIGS. 1 and 2. The implanted region is invisible. The metal contacts are not shown. This illustration is to show the topology of the single mesa etch, which can be used for either top-emitting or bottom-emitting implanted devices. The process of implant can take place before or after top metal or etch.

Figure 4:
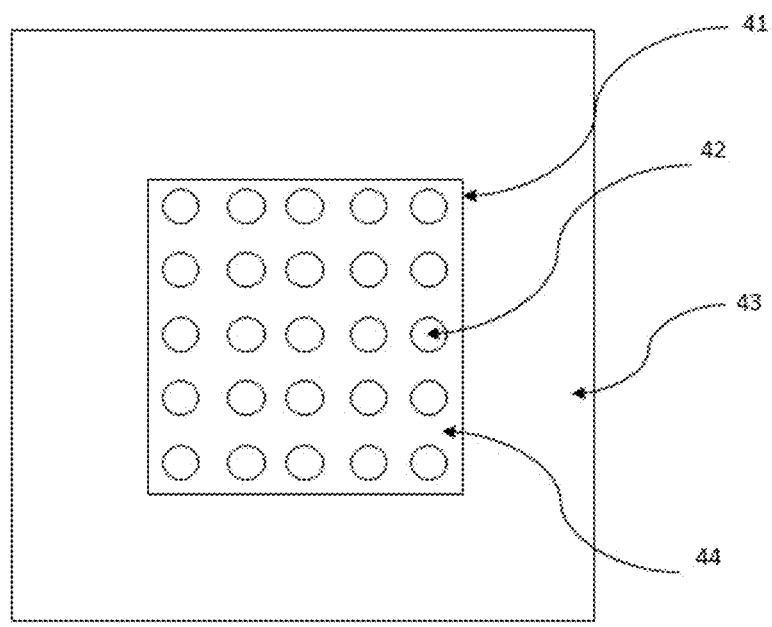
Figure 5:
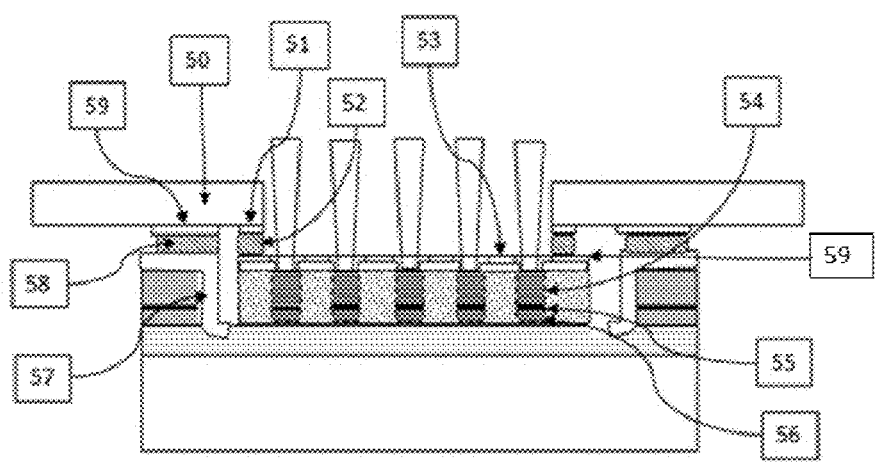

FIG. 4 shows a top view of the epitaxial side of an example top emitting VCSEL grid structure. The view is through a square hole in the top electrical waveguide which is bonded by a solder process to the laser chip. The isolation etched region is hidden in this view by the electrical waveguide. The round disks on this illustration are the holes in the top metal contact or plated metal contact region over the single solid mesa structure. FIG. 4 shows:
41 Hole in substrate with waveguide underneath
42 Holes in the top P metal so laser beams can emit through
43 Top of waveguide substrate
44 Top spreading metal on laser chip FIG. 5 illustrates a cutaway view of the bonded electrical waveguide and laser chip shown by FIG. 4. The signal contact for the electrical waveguide is opened to allow the beams to propagate through the opening. Another option of this embodiment would be to have a transparent or transmitting substrate material for the waveguide instead of a hole for the lasers to propagate through. A transparent material such as CVD (Chemical Vapor Deposited) diamond or sapphire or glass could be an example of that material. This figure shows the embodiment with a substrate such as AlNi which is opaque and thus needs a hole or opening. Notice the isolation region is separating the single mesa structure from the single mesa ground or structure or "frame" structure which is shorted to ground.

Figure 7A:
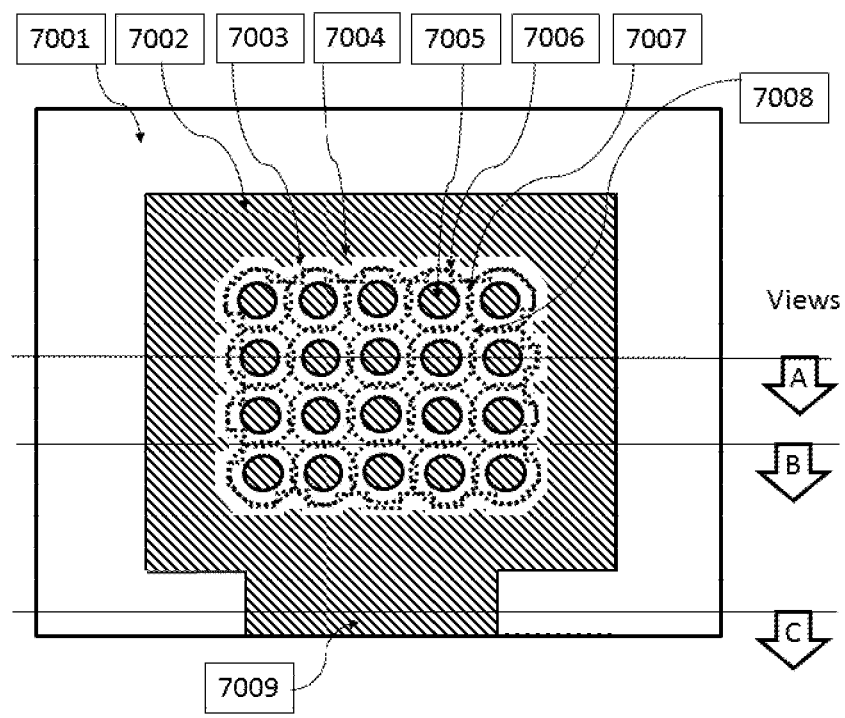
FIGS. 7A-E show views of an example top-emitting oxidation embodiment.
Figure 7B:
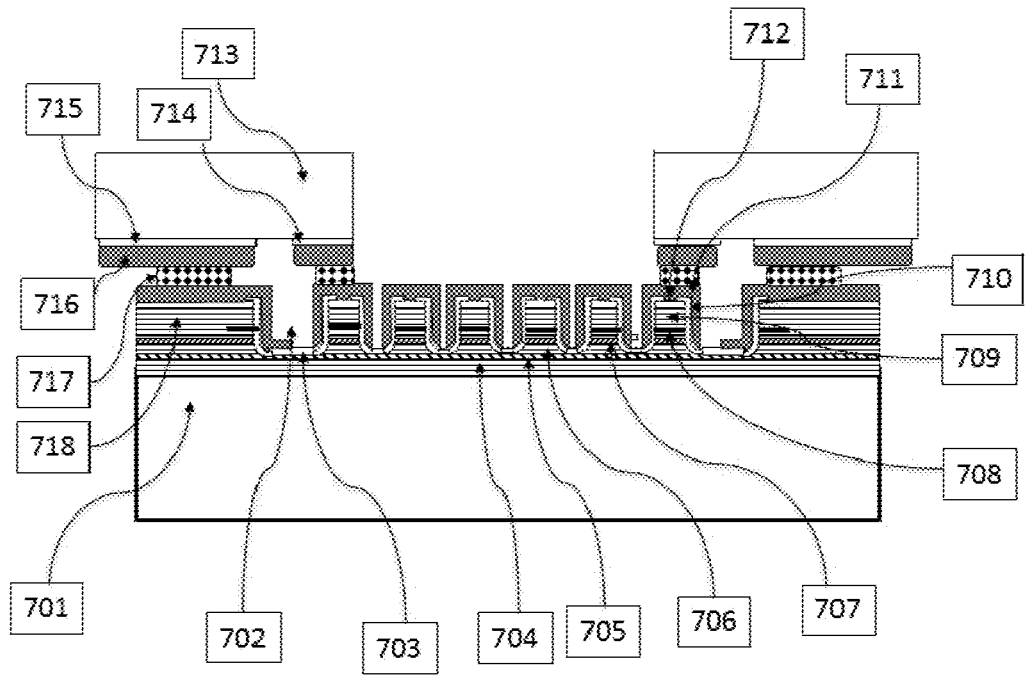
Figure 7C:
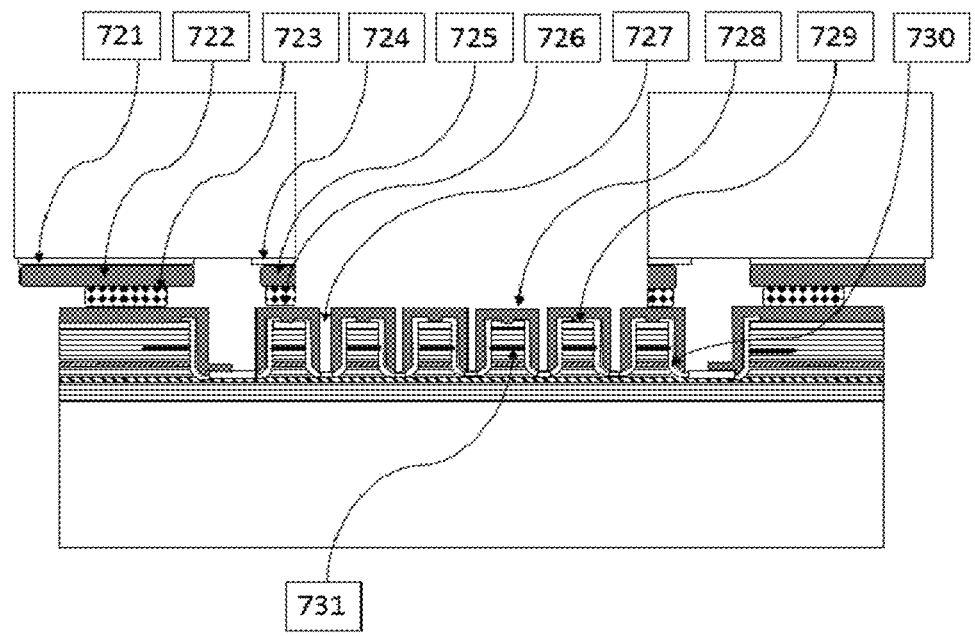
Figure 7D:
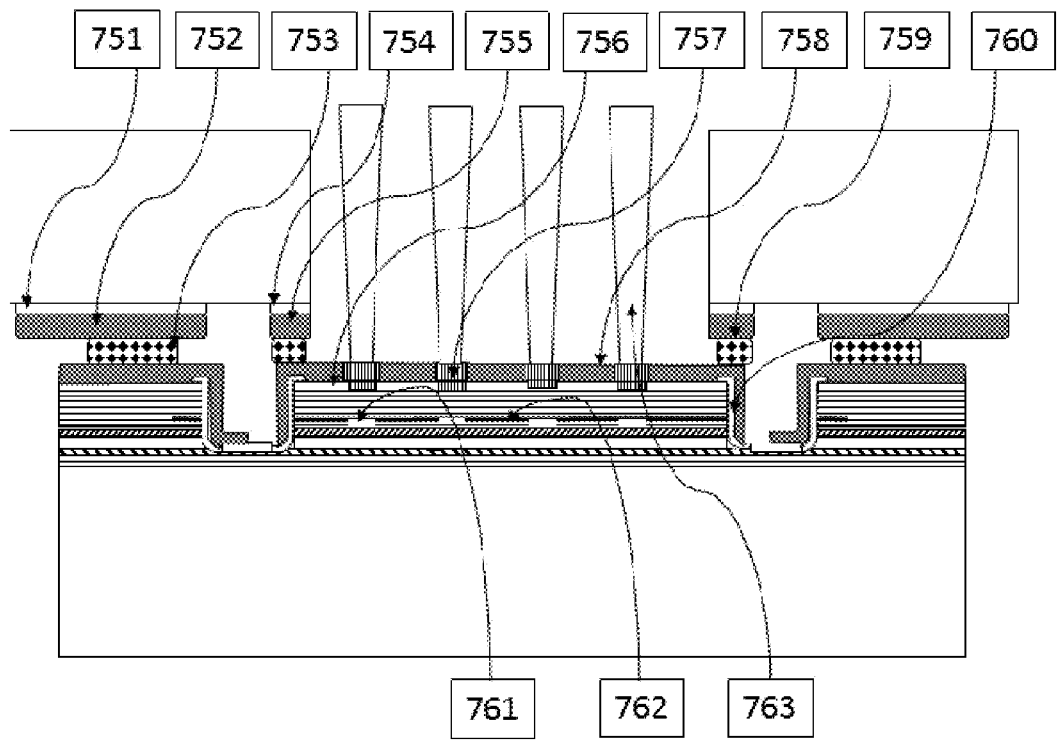

These P and N contacts are bonded to a high speed electrical contact (see also FIG. 7D, reference numbers 751 through 754). The ground-signal-ground (GSG) electrical waveguide substrate and laser chips are aligned (see FIG. 14B) so that the negative mesa is bonded to the negative part of the waveguide and the positive active areas which lase are aligned to the signal pad. This alignment is defined by a bonder, then heat and pressure are applied to bond the solder that has been deposited on one chip or the other (see FIG. 15) The high speed nature of this contact arises because the p pad is separated from the n wafer ground by plating and solder heights but mostly by removing it off the laser substrate and placing it on an electrical waveguide substrate. The physical separations dramatically reduce capacitance, thereby increasing the frequency response (where the frequency response is limited by the capacitance of the circuit) and yielding high frequency operation for the lasing grid.

In an example embodiment, for high speed operation, the surface connects to the electrical contact at the bottom of epi design, which is accomplished through the isolation trench (see, for example, FIG. 7B reference number 702) surrounding the single structure (see, for example, FIG. 7B (reference number 717)). This structure is not based on mesa topology but is simply shorted to the electrical region of the N contact metal (see FIG. 7B (reference number 703)) through the metal plating (such as in FIG. 7E reference number 782). This is not a built up structure or raised structure as described in US Pat App. Pub. 2011/0176567 but rather uses the chip surface and the epi material to be a surface for bonding, which also makes the device much more stable and robust at bonding.

Returning to FIG. 5, the GSG Signal Pad 51 has Solder 52 electrical connecting the P Contact Metal on the top of the Active Single Mesa Structure. This allows the signal or current to be injected into the metal contact structure with holes in it for laser propagation and then the current flows through the non-implanted regions of the epitaxial structures forcing current to be confined to just those defined regions. The top P mirror region has a slightly lower reflectance than the bottom N mirror allowing the light to emit from the top of the epitaxial structure. The current flows on through the quantum wells which produce the light and heat in there junction, and into the n mirror where it proceeds to the N contact region in or near the n mirror. The current would then proceed up the shorted frame structure which is bonded and in electrical contact to the ground portion of the GSG electrical waveguide. This structure which utilizes top emitting design can be used for lower wavelength output designs which are lower than the transmission cutoff of the GaAs or laser substrate material. Back emitting structures can typically only be designed for wavelengths above ~905 nm. This top emitting structure could be used with ~850 nm or lower to the limits of the epitaxial material set.

A single solid structure isolated from a surrounding ground with an etch where the single solid structure has within it ion implants; the implants are invisible but cause the semiconductor material to be nonconductive because of the crystal damage it causes. In order to make an implanted device you must mask the areas that are to be protected from the damage first.

Small mesas are formed with photoresist positioned by a photolithographic process which protects the epitaxial material from damage then is washed off after the implant takes place. The implant happens in an ion implant machine which accelerates ions down a tube and you put the wafer in front of the stream of ions.

Figure 24:
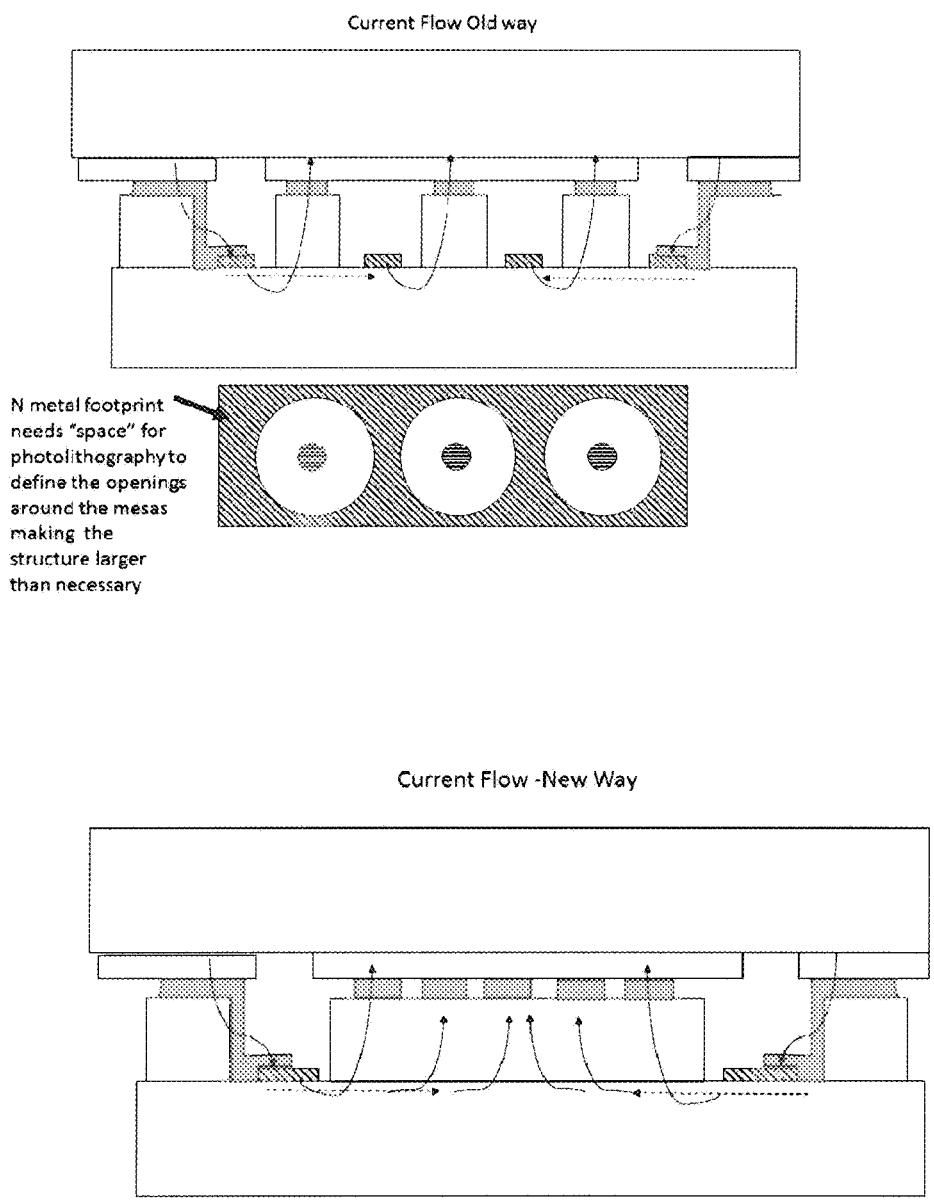
FIG. 24 comparatively shows current flow as between an example embodiment designed as described herein and that taught by US Pat App. Pub. 2011/0176567.

Implanted ions can create areas of the semiconductor material that are non-conductive. These areas of non-conductive material will force the current flow through the lase areas. These non-conductive areas can also be created by etching a pattern similar to FIG. 1 and oxidizing the single structure as described below in connection with Embodiment 2. FIG. 5 shows:
- 50 Non Conducting Electrical Waveguide Substrate
- 51 Signal metal of electrical waveguide
- 52 Solder metal for bonding electrical waveguide to laser chip
- 53 Plated Metal shorted to P Contact Layer and electrically connected to Signal pad of GSG electrical waveguide
- 54 P Output Mirror-Diffractive Bragg Reflector
- 55 Active Region-Quantum Wells
- 56 N Mirror where low resistance contact Layer is located
- 57 Plated Metal shorting or in electrical contact with N Contact layer and to Ground Mesas
- 58 Solder in Electrical contact with Ground pad of electrical high speed waveguide and in electrical contact with Grounded Mesa structure
- 59 Area on Plated metal connected to P Metal on single mesa structure for contacting signal pad on high speed electrical waveguide FIG. 24 shows a comparative view of different current flows as between an embodiment such as Embodiment 1 and the design taught by US Pat App. Pub. 2011/0176567. With US Pat App. Pub. 2011/0176567, each mesa is surrounded by an N metal contact area. This takes precious space or real estate on the chip as the processing to define those footstep metal n contacts around each mesa require photolithography which limits how closely you can space the mesas together. These limits lead to a lower power output per unit area than the new method. Therefore the goal of this old apparatus was an array for highest power and speed yet did not take into account the vast improvement in power/area which would also be an improvement in the ultimate goal of highest Power with the highest Speed. Also, this old method's N contact had to be large because of the structural limitations from the old method has been removed with the new single structure.

With the new design described herein, a single structure has several lasers on it and only one contact around that single structure. The new structure reduces that N metal area to the outside of the structure making the area per light element much smaller. This involves a large N contact layer calculated to carry the current load of the single structure. The higher current flow from the single contact can be realized through thicker metal and or thicker N contact region.

Embodiment 2—Bottom-Emitting Implant

Figure 6:
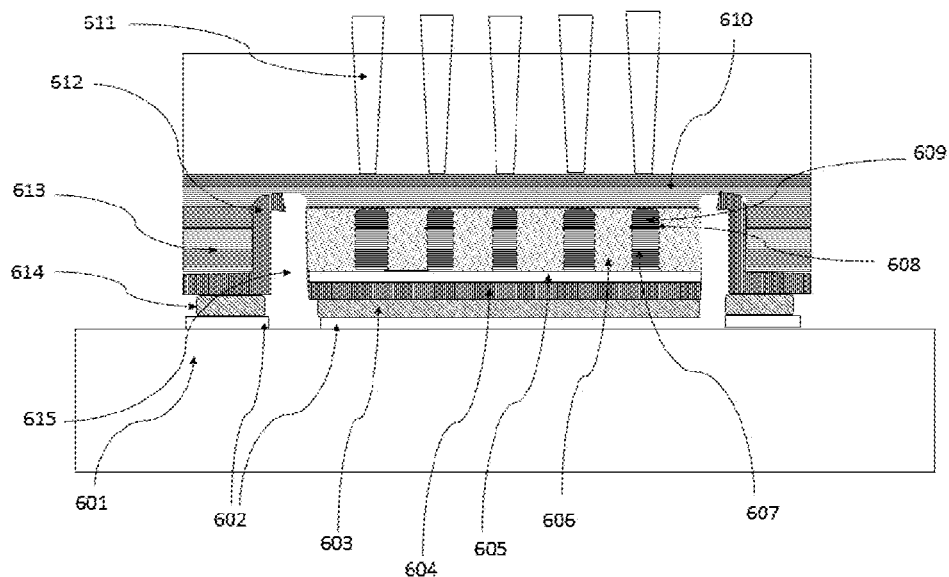
FIG. 6 shows a view of an example bottom-emitting implant embodiment.

FIG. 6 illustrates a cutaway view of an example of a second embodiment, where the second embodiment is a bottom-emitting device with implanted regions for current confinement. The GSG electrical waveguide can be seen solder bonded to the frame-ground structure and the active single laser mesa structure. FIG. 6 shows:
- 601 Electrical Waveguide Substrate
- 602 Ground Contact and Signal Contact in that order of GSG Electrical Waveguide
- 603 Solder-Bonding GSG Waveguide to Laser Chip
- 604 Plating Metal electrically connecting Signal pad of Electrical Waveguide to Lasers P contact
- 605 P contact Metal
- 606 Implanted Region that has been rendered non conductive
- 607 P mirror
- 608 Active region (quantum wells)
- 609 N Mirror
- 610 Conducting Layers in N Mirror where Implant has not reached
- 611 Laser Beams Propagating through Laser Substrate
- 612 Plating Metal shorted to N contact region
- 613 Frame Area Shorted to N Contact region
- 614 Solder electrically contacting N contact on Laser to Ground on Electrical Waveguide
- 615 Etched region isolating large single mesa from Ground Frame Process for Embodiments 1 and 2

An example embodiment of the process steps to create the single structure for embodiments 1 and 2 with implant current confinement can be as follows.
- Step 1. Use photolithography to mask areas which will not have P Metal deposited.
- Step 2. Deposit P Metal (typically TiPtAu~2000 A)
- Step 3. Photolithography lift off and wafer cleaning. O2 descum or ash all organics off wafer.
- Step 4. Dielectric deposit (typically SiNx~<1000 A) used as an etch mask
- Step 5. Photolithographic masking using either photoresist or metal deposited in areas to protect the epi material from being damaged from the implant which makes the unprotected regions non-conductive through ion bombardment. This step can be performed later in the process but may be more difficult due to more varied topology.
- Step 6. Implant—Those skilled in the art of calculating the implant doses will determine the dose and species of implant needed to disrupt the materials structures to the depth which will isolate the p regions and the quantum wells from each other—
- Step 7. Cleaning this photolithography is difficult due to the implant and a deposition of metal over the photolithography such as plating could help to make it easier to clean off the resist.
- Step 8. Use photolithography to mask areas of dielectric which will not be etched. This is the unique part which is the design of the mask which creates a large isolated structure down implants within that structure define where current cannot flow.
- Step 9. Use plasma etch to etch through dielectric (typically Fl based etchant) can use wet etch such as BOE (buffered oxide etch).
- Step 10. Etch pattern into Laser or Light Emitting Diode Epitaxial material. Stop on Substrate or doped electrical contact layer. This isolates a single large structure from the N shorted regions around the chip
- Step 11. Clean off mask. O2 descum or ash all organics off wafer.

Step 12. Use photolithography to mask areas which will not have N Metal deposited.

Step 13. Deposit N Metal (Typically GeAu/Ni/Au eutectic composition of 80% Au/20% Ge by atomic weight. Total thickness of AuGe layer~3000 A or more with ~200 A Ni or more of other diffusion barrier metal and ~5000 A of Au or more This is also unique hear where the n metal is deposited in the n contact etched region and also up and over the N contact structure shorting the structure to the n-contact.

Step 14. Clean off mask (typically called lift off). O2 descum or ash all organics off wafer.

Step 15. Dielectric deposit (typically SiNx~2000 A) used as a non-conductive isolation barrier Step 16. Use photolithography to mask areas of dielectric which will not be etched.

Step 17. Use plasma etch to etch through dielectric (typically Fl based etchant) can use wet etch such as BOE (buffered oxide etch).

Step 18. Clean off mask. O2 descum or ash all organics off wafer.

Step 19. Use photolithography to mask areas which will not have Plated Metal deposited.

Step 20. Plate areas with ~4-5 um of Metal (typically Au) or Cu if diffusion barrier can be deposited first.

Step 21. Use photolithography to mask areas which will not have Solder deposited.

Step 22. Deposit Solder Metal (Typically AuSn/Au eutectic composition of 80% Au/20% Sn by atomic weight. Total thickness of AuSn layer~40000 A (4 microns) or more with ~500 A Au on top to stop any oxidation of Sn. This layer can be patterned and deposited on the submount with electrical waveguide which is bonded to the laser grid.

Embodiment 3—Top-Emitting Oxidation

In a third embodiment, oxidation rather than ion implantation is used to create the grid of top-emitting lasing regions within the single structure. For example, a patterned etch can isolate conductive paths in a single structure, creating a grid of light sources. This structure exhibits multiple laser emission points from the single structure. The lasing structure is isolated with an etched region from the ground contact that forms the outside perimeter of the chip. This structure for Embodiment 3 is top emitting. The conductive areas of the grid are where light will be emitted. The positive electrical contact can be a grid with openings where the light is emitted.

The epitaxial material of the laser wafer can be a VCSEL design, and most VCSELs are top emitting. The distribution of the signal using a p type waveguide pad is typically on the laser wafer, but it should be understood that in an oxidated single structure embodiment that has a back emitting design, the waveguide can be on a separate substrate that is separated from the laser n material or layer.

FIG. 7A, which shows an example of Embodiment 3, illustrates an example pattern etched into a wafer to create a single structure which allows multiple point lasing. The single structure of an embodiment such as that shown by FIG. 7A is much more rigid than the thin columns made of fragile crystal material as taught by US Pat App. Pub. 2011/0176567. Also, as explained with respect to an embodiment discussed above, it should be understood that pattern of lasing areas other than that shown by FIG. 7A may be employed if desired by a practitioner.

In FIG. 7A, the diagonally striped areas are preferably etched down to create the patterned single mesa structure in the middle of the isolation trench. All diagonally striped areas are preferably etched down to the bottom N electrically conductive layer 705 in FIG. 7B or typically the larger isolation trench will be etched to the electrical contact buried in the epitaxial design, while the smaller patterned etch areas must go deeper than the active region which isolates the lasing points. The patterned structure in the middle of the isolation trench is a single structure with "shaped" holes etched into it.

The holes in the large single mesa are large in this case. These holes allow the oxidation process environment to oxidize the layers in the epitaxial region. The oxide layer or layers has high aluminum content and forms $AlO_2$ that grows laterally through the layer until taken out of the oxidation process. White areas are the surface of the chip, dotted lines are where oxidation limits current flow to unoxidized areas only. The holes in the large single mesa are large in this case. These holes allow the oxidation process environment to oxidize the layers in the epitaxial region. The oxidation layer can be formed by using a high Al content layer in the epi design structure which is buried below the surface. The etched areas expose that layer which is then placed in an oxidation chamber allowing the exposed layer to oxidize inward, where $AlO_2$ grows laterally through the layer until taken out of the oxidation process. As the length of the oxidation grows in that thin layer, it isolates or closes off the current paths with a dielectric material of $AlO_2$ that is formed during the oxidation process. If the areas 7005 are etched, then the oxidation will continue to grow until only areas 7008 are conductive and the area or part of the epitaxial layers which conduct the current through that section. Electrically conductive areas allow current flow through the quantum wells (see FIG. 7B reference number 707) and produce lasing as the light is trapped in the cavity between the p mirror 709 and N mirror 706.

Figure 7E:
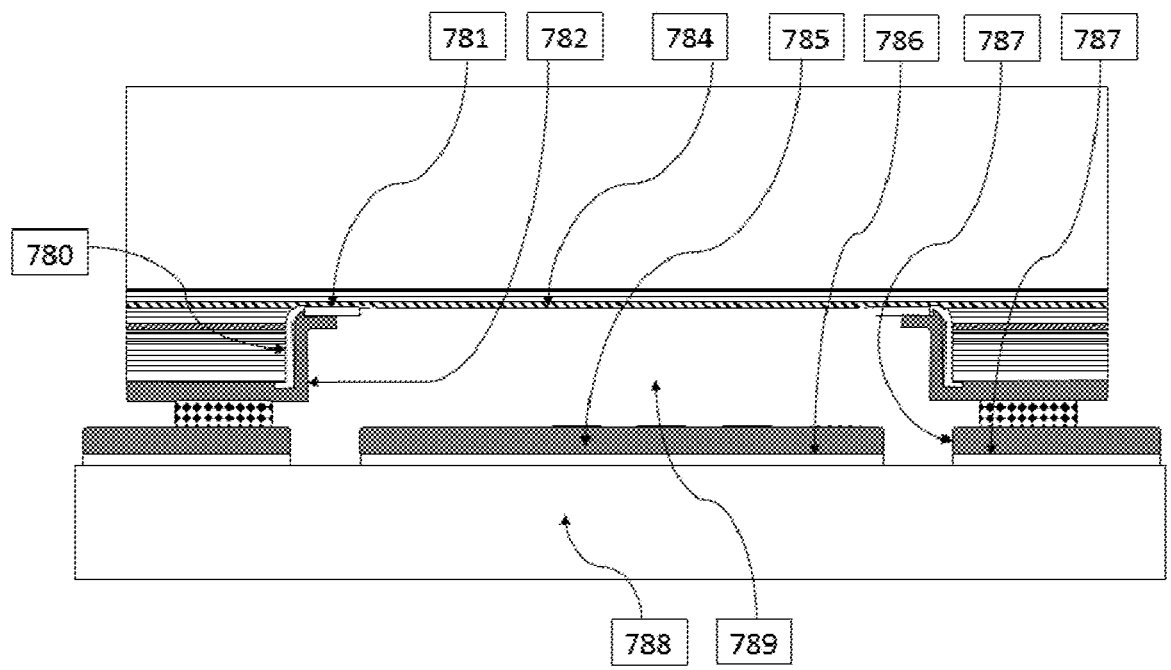

The oxidation length can be seen in FIG. 7A as dotted lines, all about the same distance from any one exposed edge or holes in the large single structure that has holes formed in it. FIG. 7A also shows the large single mesa ground structure. Three views of cross sections are illustrated to identify where FIGS. 7B, 7D, and 7E are located. Note FIG. 7D which clearly shows through this cross section that the mesa in the center is a single structure.

FIG. 7A shows:
7001 Frame (Single Shorted Mesa) for Electrical Contact to Ground of Electrical Waveguide
7002 Etched region isolating large single mesa from Ground Frame
7003 Single Mesa Structure with Etched Holes
7004 Indents in Edges to keep edges of Single Mesa Structure Oxidized and Non Conductive
7005 Etched Hole in Single Mesa Structure
7006 Oxidation Pattern around any Etched Edges
7007 Overlapped Oxidized Areas not allowing Current Flow
7008 Laser Aperture where Current Flows freely (same as 761 in FIG. 7D)
7009 Gap in Shorted Mesa Structure to Reduce Capacitance from Ground to Signal Pad on Electrical Waveguide FIGS. 7B, 7C and 7D are side views of the example FIG. 7A embodiment.

FIG. 7C shows the etched holes 727 that allow the oxidation 731 to form, which confines the current into region 761 of FIG. 7D, for formation of laser beams 763.

Reference number 706 in FIG. 7B is a p mirror diffractive Bragg reflector (DBR) which has one or more layers in it with very high aluminum content 708 which when exposed to hot damp conditions oxidizes 708 confining the current to the areas 761 shown by FIG. 7D, which are where the laser beams come out. The N mirror DBR 709 has a conductive layer 705 to take the current flow out through the N metal ohmic contact 703 to the plating 782 (see FIG. 7E) which goes up and over the single ground mesa structure 718 (see FIG. 7B) to the solder 717 and electrically connecting to the N plating on the GSG waveguide 716 and into the N contact 715 of the waveguide.

Current confinement is a major part of a semiconductor laser. The concept is to force the current flow away from the edges of the structure so there is not an issue with current flowing near rough surface states that may exist from the etch. The current flow is also ideally concentrated to create lasing by increasing the current density in the material The current confinement occurs either by oxidation through allowing the high concentrate layers of Al to get exposed by hot damp conditions in the oxidation process enabled by the drilled holes (e.g., this Embodiment 3), or by the implant to render all other areas nonconductive (e.g., see Embodiments 1 and 2).

FIG. 7B shows:
- 701 Electrical Waveguide Substrate
- 702 Etched region isolating large single mesa from Ground Frame
- 703 N Metal contact electrically contacting N contact layer
- 704 N Mirror
- 705 N Contact layer in N mirror (low resistance for ohmic contact)
- 706 N Mirror above N contact region
- 707 Active region (quantum wells)
- 708 Oxidized Layer Closing off Current in these Regions
- 709 P mirror
- 710 Dielectric Layer
- 711 Plating on top of P contact Metal
- 712 Aperture in P Contact Metal and Plating Metal for laser beam exit
- 713 Electrical Waveguide Substrate
- 714 Ground Contact of GSG Electrical Waveguide
- 715 Signal Contact of GSG Electrical Waveguide
- 716 Solder-Bonding GSG Waveguide to Laser Chip
- 717 Solder-Bonding GSG Waveguide to Laser Chip
- 718 Frame structure electrically connected to N contact region of laser chip FIG. 7C is a continuation of FIG. 7B above, and it further shows:
- 721 Ground Contact of GSG Electrical Waveguide
- 722 Plating on Ground Contact of GSG Electrical Waveguide
- 723 Solder-Bonding GSG Waveguide to Laser Chip
- 724 Signal Contact of GSG Electrical Waveguide
- 725 Solder-Bonding GSG Waveguide to Laser Chip
- 726 Plating on Signal Contact of GSG Electrical Waveguide
- 727 Etched Hole Regions in Single Mesa Substrate permits oxidation to form Current Confinement Apertures
- 728 Plating on top of P contact Metal
- 729 Opening in Dielectric layer for electrical contact from Plating to P Contact Layer on Laser Single Mesa Structure
- 730 Dielectric Layer
- 731 Oxidation Layer closing off current near Etched Hole Regions FIG. 7D is a FIG. 7A cutaway view that also shows the electrical connections and electrical waveguide that are not shown in FIG. 7A. FIG. 7D illustrates the cross section through the apertures created by the oxidized layer. The oxidized layer is exposed to the oxidation process through the holes in the single structure illustrated in FIG. 7B. This view also shows that the Active Mesa Structure is truly a Single Mesa Structure. FIG. 7D depicts:
- 751 Ground Contact of GSG Electrical Waveguide
- 752 Plating on Ground Contact of GSG Electrical Waveguide
- 753 Solder-Bonding Ground of GSG Waveguide to Laser Chip
- 754 Signal Contact of GSG Electrical Waveguide
- 755 Plating on Signal Contact of GSG Electrical Waveguide
- 756 P contact Metal on Laser Chip
- 757 Opening in plating and P Contact Metal over Laser Aperture
- 758 Plating on P Contact Metal
- 759 Solder-Bonding Signal of GSG Waveguide to Laser Chip
- 760 Dielectric Layer Protecting Active Mesa Structure from N Contact
- 761 Current Confinement Aperture formed by opening in Oxidation Layer
- 762 Oxidation Layer Dielectric
- 763 Laser Beam Propagating through Metal Opening FIG. 7E is a cross sectional view of the area where the P Contact or Signal of the GSG waveguide is positioned below the Laser Chip where the N Contact Frame or single structure mesa grounded to the N contact of the laser is above the GSG Electrical Waveguide. The large gap between the Laser Ground and the P Signal Pad reduces the capacitance of the circuit enabling higher frequency operation. FIG. 7E depicts:
- 780 Dielectric Layer
- 781 N Type Ohmic Contact Metal
- 782 Plating Shorting N Metal Contact to Single Ground Mesa Structure
- 784 N Contact Layer in Epitaxial Growth
- 785 Plating Electrically Contacted to Signal Pad on Electrical Waveguide
- 786 Metal Signal Pad Lead on GSG Electrical Waveguide
- 787 Plating on Ground Pad of GSG Electrical Waveguide
- 788 Electrical Waveguide Substrate
- 789 Gap between Conductive Signal Pad Structure and N Contact Layer Reduces Capacitance Process for Embodiment 3

An example embodiment of the process steps to create the single structure for embodiment 3 with oxidation current confinement can be as follows.

Step 1. Use photolithography to mask areas which will not have P Metal deposited.

Step 2. Deposit P Metal (typically TiPtAu~2000 A)

Step 3. Photolithography lifts off and wafer cleaning. O2 descum or ash all organics off wafer.

Step 4. Dielectric deposit (typically SiNx~<1000 A) used as an etch mask

Step 5. Use photolithography to mask areas of dielectric which will not be etched.

Step 6. Use plasma etch to etch through dielectric (typically F1 based etchant) can use wet etch such as BOE (buffered oxide etch).

Step 7. Etch pattern into Laser or Light Emitting Diode Epitaxial material. Stop on Substrate or doped electrical contact layer. Typically the etch is Cl based with some (high percentage) amount of BCl3.

Step 8. Clean off mask. O2 descum or ash all organics off wafer.

Step 9. Use photolithography to mask areas which will not have N Metal deposited.

Step 10. Deposit N Metal (Typically GeAu/Ni/Au eutectic composition of 80% Au/20% Ge by atomic weight. Total thickness of AuGe layer~3000 A) or more with ~200 A Ni or more of other diffusion barrier metal and ~5000 A of Au or more Step 11. Clean off mask (typically called lift off). O2 descum or ash all organics off wafer.

Step 12. Dielectric deposit (typically SiNx~2000 A) used as a non-conductive isolation barrier Step 13. Use photolithography to mask areas of dielectric which will not be etched.

Step 14. Use plasma etch to etch through dielectric (typically Fl based etchant) can use wet etch such as BOE (buffered oxide etch).

Step 15. Clean off mask. O2 descum or ash all organics off wafer.

Step 16. Use photolithography to mask areas which will not have Plated Metal deposited.

Step 17. Plate areas with ~4-5 um of Metal (typically Au) or Cu if diffusion barrier can be deposited first.

Step 18. Use photolithography to mask areas which will not have Solder deposited.

Step 19. Deposit Solder Metal (Typically AuSn/Au eutectic composition of 80% Au/20% Sn by atomic weight. Total thickness of AuSn layer~40,000 A (4 microns) or more with ~500 A Au on top to stop any oxidation of Sn. This layer can be patterned and deposited on the submount with electrical waveguide which is bonded to the laser grid.

Step 20. Separate laser chips from wafer with cleaving or dicing.

Step 21. Design and Fabricate electrical waveguide to align to laser chip with the design to allow high frequency operation.

Step 22. Align and Flip Chip Bond the laser chip to the Submount electrical waveguide Embodiment 4—Bottom-Emitting Oxidation In a fourth embodiment, an oxidated single structure with multiple lasing regions is designed as a bottom-emitter rather than a top emitter. FIG. 8 through FIG. 14C provide details about Embodiment 4 and illustrate the process which can be used to make this embodiment. The lasing grid's light is emitted through the substrate forming a back emitter.

Light is transmissive in GaAs from wavelengths around 900 nm and greater. If the wavelength of the light engineered in the epitaxial design is in the range~900 nm and above, the GaAs substrate transmits the light or is transparent to the light. If the epitaxial design includes an N mirror that is less reflective than the P mirror, a laser such as a VCSEL can emit the light from the N mirror through the substrate. The laser beams will propagate through the material, and the substrate can be a platform for optical components to collimate, spread, diverge, converge or direct the light. This enables integrated optical circuits with extremely high bright power to be formed. The single structure and the ground contact can then be integrated to a high speed electrical waveguide substrate enabling high frequency responses from the entire grid. A ground signal ground electrical waveguide is ideal for this high speed electrical waveguide. Another type of electrical waveguide that may be used is a microstrip waveguide (see FIG. 15), where the signal pad is separated from the ground pad by a thin dielectric layer on a substrate.

Figure 8:
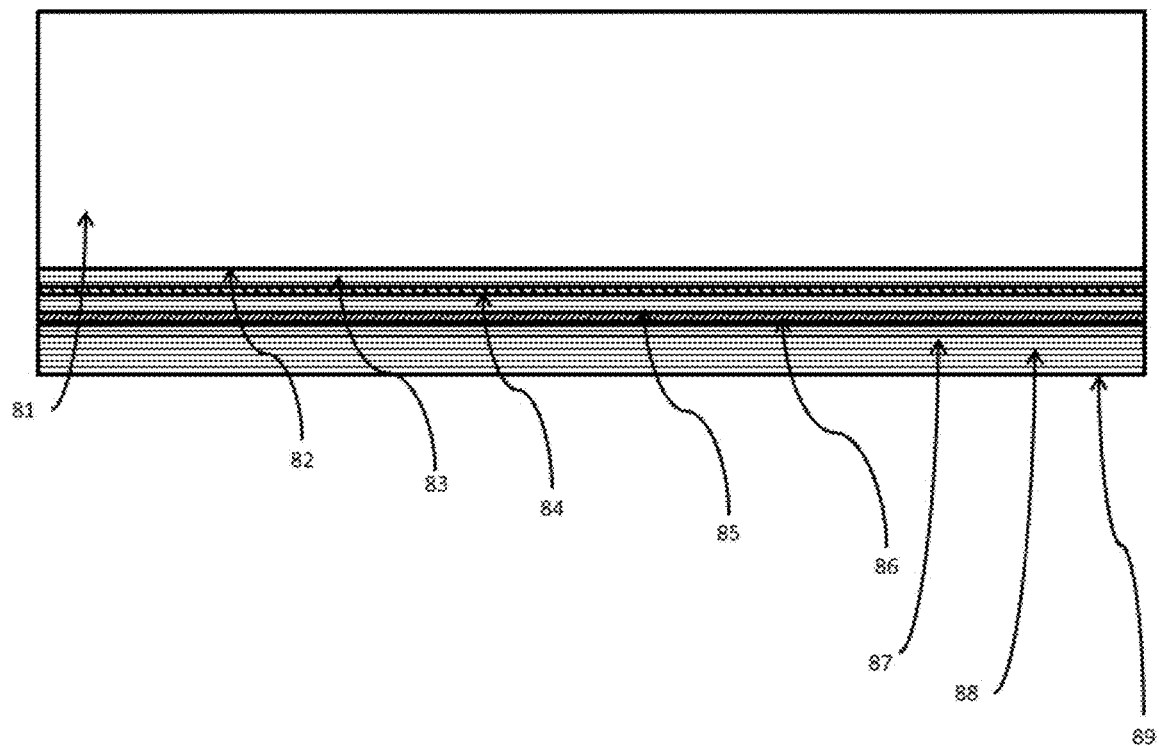
FIGS. 8-14C show various views of an example bottom-emitting oxidation embodiment.
Figure 9:
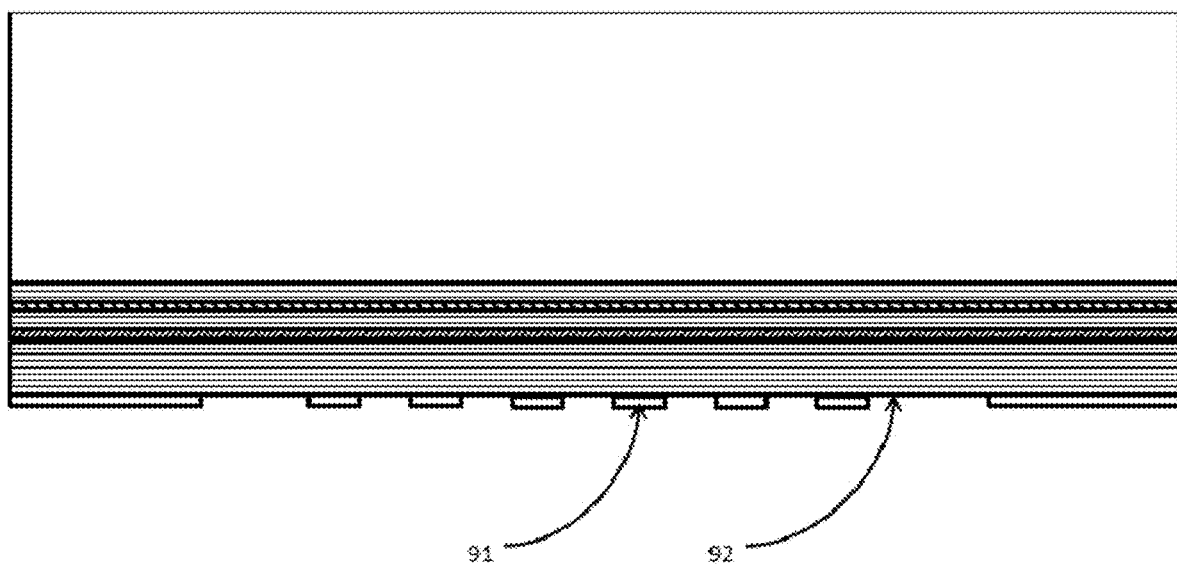
Figure 10A:
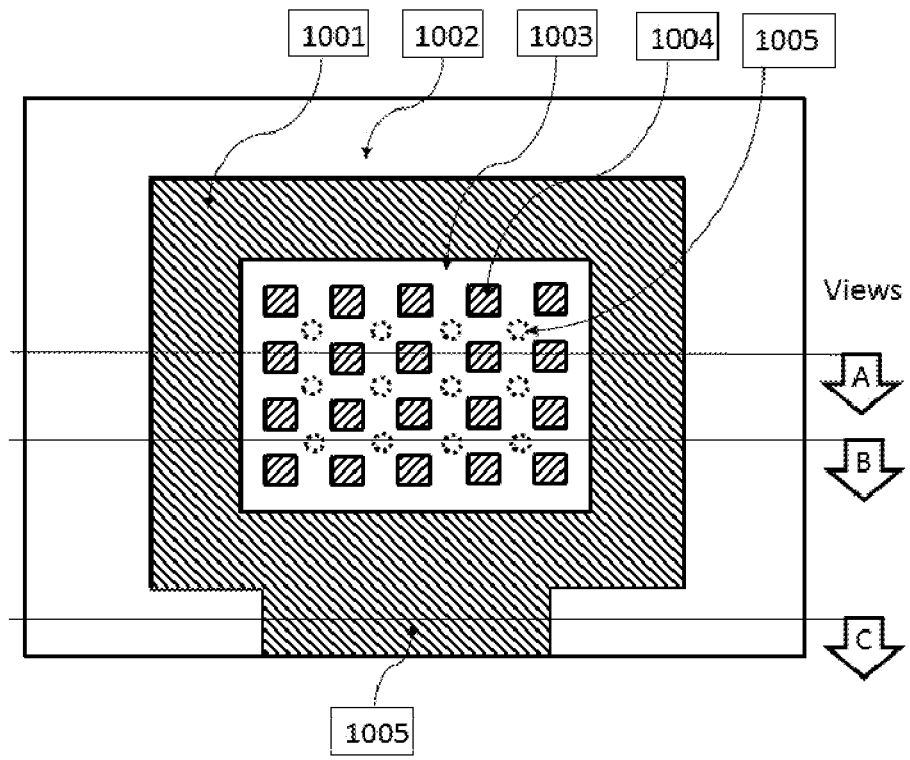
Figure 10B:
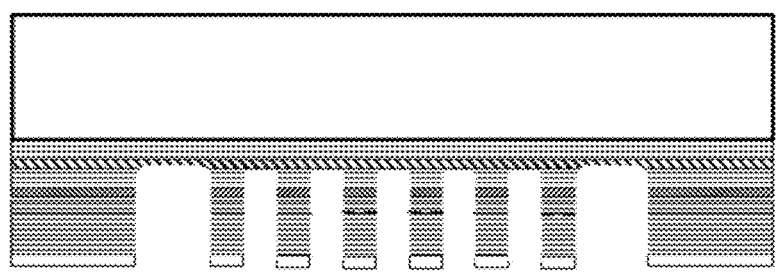
Figure 10C:
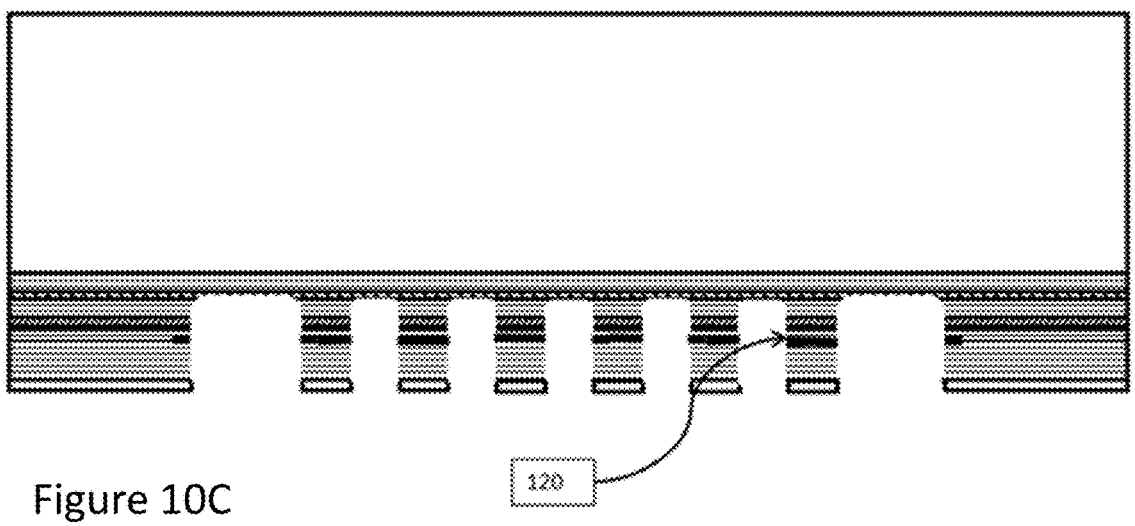

FIG. 8 is an illustration of a typical epitaxial design. Any high speed design can be used for VCSEL devices. FIG. 8 shows:
- 81 GaAs substrate
- 82 Possible position for low resistance contact layer
- 83 N Mirror layer after contact region
- 84 Low resistance N contact region
- 85 N Mirror layer after quantum wells
- 86 Quantum Well Region
- 87 Oxidation layers
- 88 P Mirror
- 89 Low resistance P Contact layer FIG. 9 is an illustration of the first process performed, which is P metal deposit. This is typically a Ti/Pt/Au Layer on top of the highly P doped Contact Layer forming an ohmic contact. FIG. 9 shows:
- 91 P Metal forming Ohmic Contact after annealing process
- 92 Low Resistance P Contact Layer FIG. 10A is a top view of the etch of the epitaxial layer down to the N contact layer. FIG. 10A shows:
- 1001 Etched Area to N Contact Layer
- 1002 Single Mesa Ground Structure
- 1003 Single Mesa Active Structure
- 1004 Etch Hole to Allow Oxidation Process to form Apertures
- 1005 Area in between all holes where there will be no oxidation which forms conductive current confinement FIG. 10B is a cross section view A of FIG. 10A formed before oxidation process, and FIG. 10C is a cross section view A of FIG. 10A formed after oxidation process. FIG. 10C shows:
- 120 Oxidation completely closes off conductive path near any etched regions that were exposed during the oxidation process.

Figure 10D:
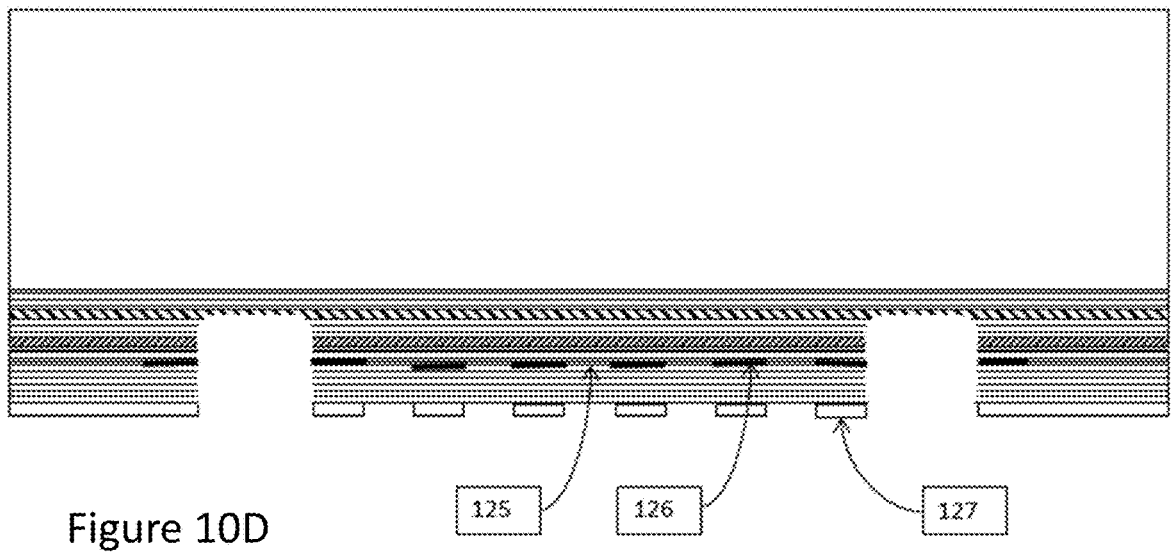
Figure 11:
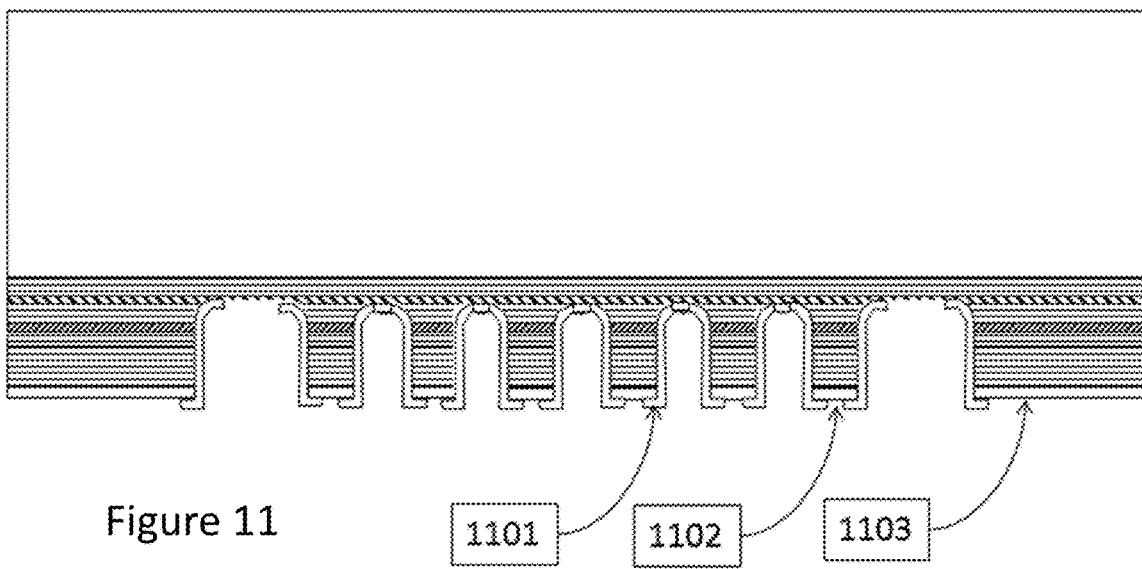
Figure 12:
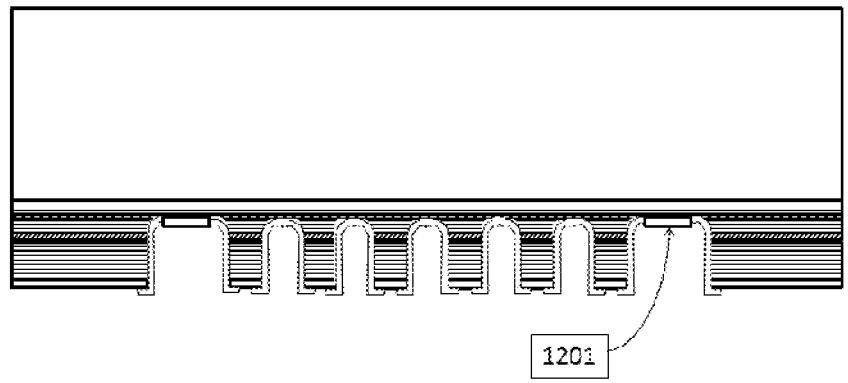

FIG. 10D is a cross sectional view B of FIG. 10A illustrating where the current confinement apertures were formed in the areas shown. This view represents a section of the single mesa where no holes are penetrating the cross section, and clearly shows that the mesa structure is a Single Mesa Structure enabling a more robust structure preferred at the bonding process. FIG. 10D shows:
- 125 Current Confinement Aperture is conductive region of Single Mesa Structure
- 126 Oxidized Layer forming as dielectric layer near where holes where etched
- 127 P Metal Contact Layer FIG. 11 illustrates the dielectric layer deposited and patterned with opened via "holes" for electrical contact to the epitaxial contact layers and sealing the semiconductor for reliability purposes. FIG. 11 shows:
- 1101 Dielectric Layer patterned with openings or "vias"
- 1102 Opening in Dielectric Layer to P Contact Metal
- 1103 Contact Layer on Single Mesa Ground Structure FIG. 12 shows the N metal contact after it has been deposited. FIG. 12 depicts:
- 1201 N Contact Metal is deposited over the N Contact via hole to make an electrical connection to the N Contact Layer.

Figure 13:
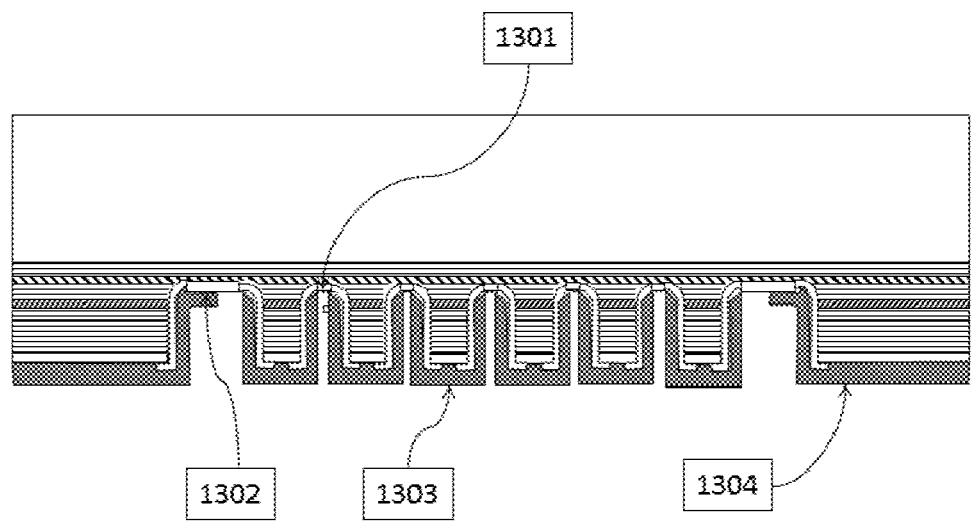

FIG. 13 illustrates the next step of plating metal which shorts the N contact region to the top of the single grounded frame region, which will be bonded and electrically conductive to the ground pad of the GSG waveguide. The plating also adds height to the active region reducing capacitance and it removes heat from the active region of the devices to give the devices better performance. The plating over the active single structure is isolated from the N mirror and N contact region by the dielectric layer. FIG. 13 shows:

1301 Dielectric Layer preventing the Plating covering the Active Region and extending into the holes of the single mesa structure 1302 Plating Covering Single Grounded Mesa Structure Shorted to N Contact Region through N Contact Metal 1303 Plating Covering Active Structure and extending into the holes of the active region where cooling can occur through a higher thermal conductance of the plating metal 1304 Plated Metal extending over single frame structure for bonding and electrically connecting to ground of GSG electrical waveguide.

Figure 14A:
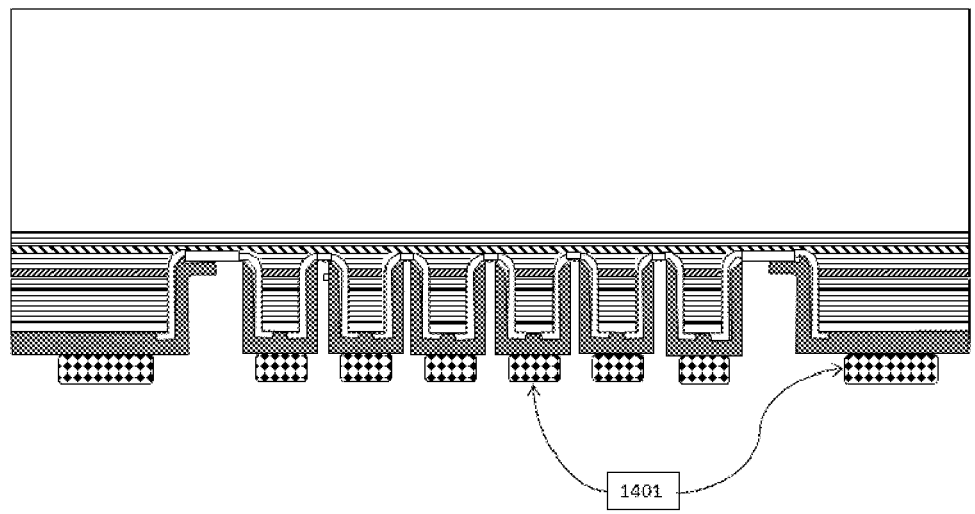

FIG. 14A illustrates solder deposited on the laser chip. This serves as the electrical conductive bonding adhesion layer between the laser chip and the high speed electrical waveguide. FIG. 14A shows:

1401 Solder deposit

Figure 14B:
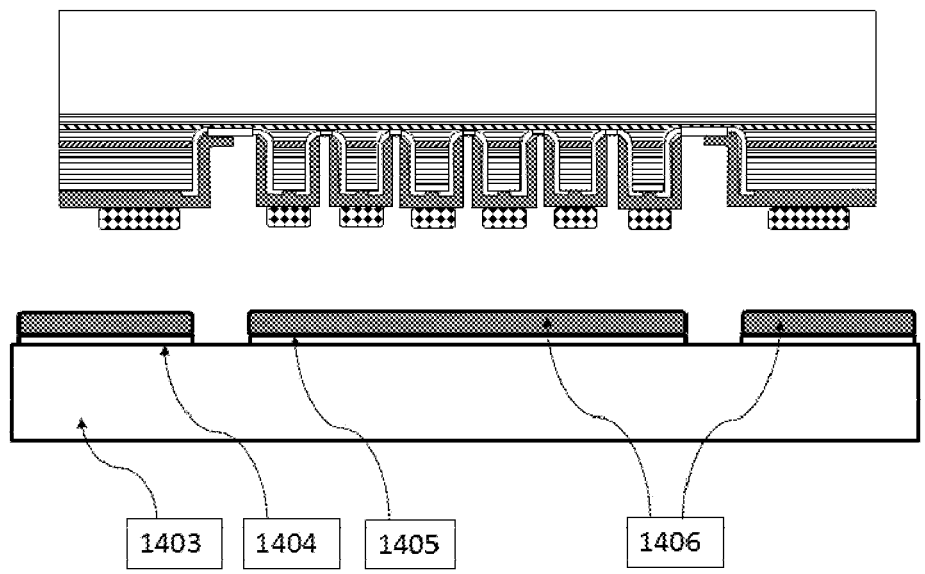

FIG. 14B illustrates the alignment of the GSG electrical waveguide before bonding. FIG. 14B shows:

1403 Submount for GSG Electrical High Speed Waveguide

1404 Ground Pad for GSG Electrical High Speed Waveguide

1405 Signal Pad for GSG Electrical High Speed Waveguide

Figure 14C:
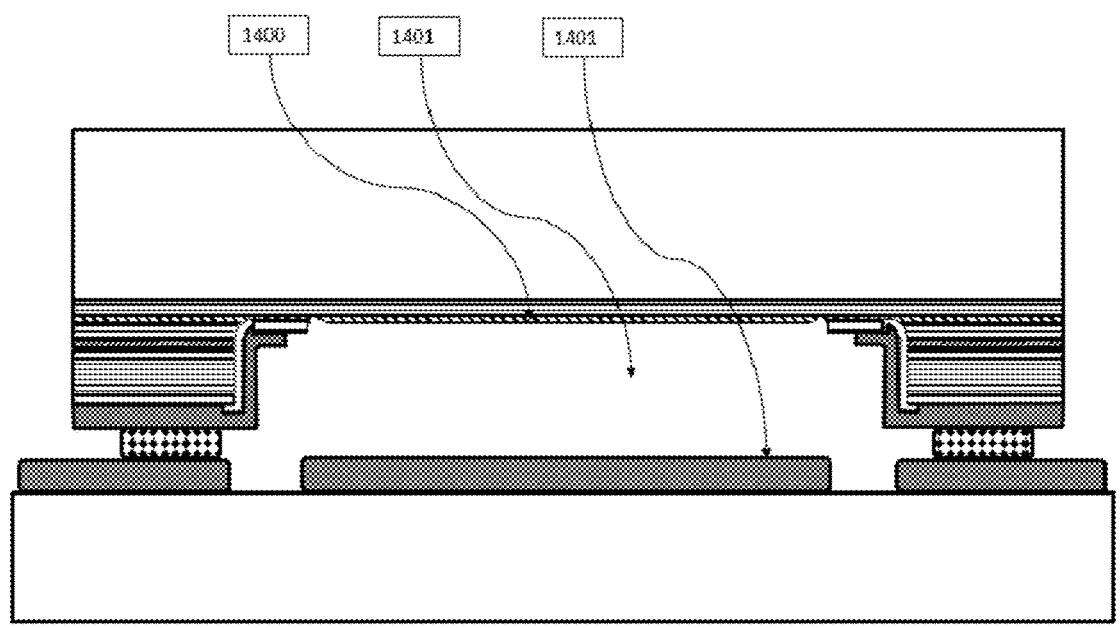

1406 Plating Metal Deposited on Conductive areas of GSG Electrical High Speed Waveguide FIG. 14C illustrates the bonded laser chip to the GSG electrical waveguide. The gap in the single grounded mesa enables high speed operation by reducing capacitance.

Embodiment 5

Figure 15:
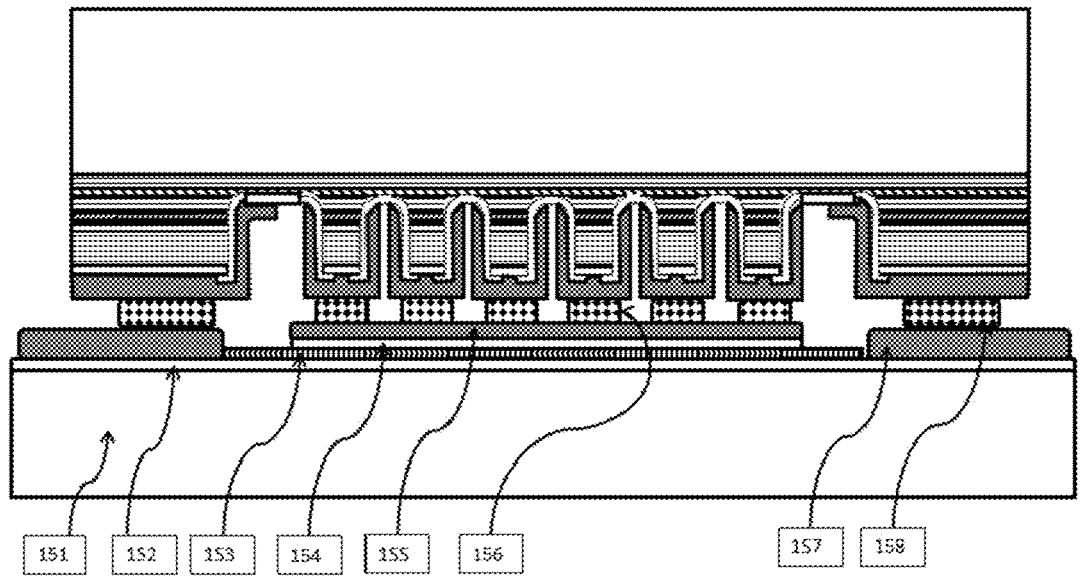
FIG. 15 shows a view of an example microstrip embodiment.

In a fifth embodiment, a microstrip or strip line electrical waveguide is used rather than the GSG waveguide, as shown by FIG. 15. This embodiment can also have the gap mentioned in FIG. 14C above. This electrical waveguide can also be formed by a ground layer below a thin dielectric with a signal lead on the top of the dielectric forming a strip line or microstrip waveguide. Openings in the dielectric can be used to contact the ground portion of the lasing grid. The width of the lines and thickness of the dielectric can be controlled to produce a specific impedance value for circuit matching characteristics. It should be understood that this technique can also be used for other embodiments, such as Embodiment 2 or any of the embodiments discussed below. The view in FIG. 15 shows a cross section across the active single mesa structure:

151 Waveguide substrate

152 Metal Ground Pad across the entire waveguide

153 Dielectric layer separating the Ground from the signal pads

154 Metal Signal Pad

155 Metal Plating on Signal pad

156 Solder electrically connecting the signal pad to the single active mesa shown here with gaps or holes etched into it.

157 Metal Plating on the Ground Pad

158 Solder electrically connecting the ground pad to the single grounded mesa

Embodiment 6

Figure 16:
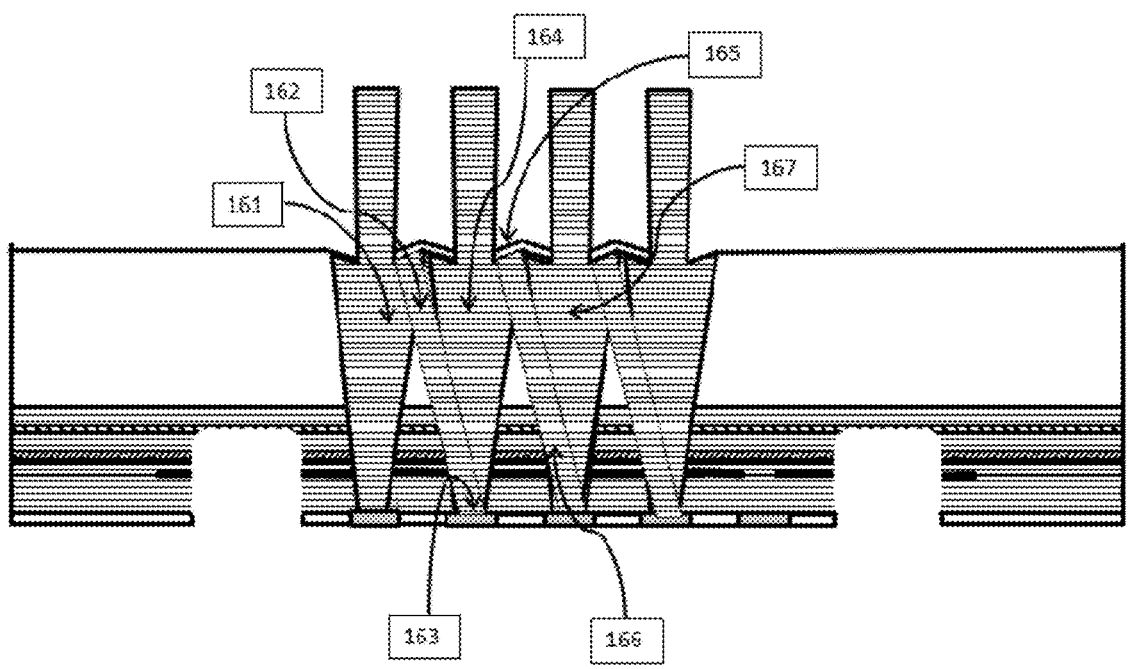
FIG. 16 shows a view of an example phase coherent embodiment.

FIG. 16 shows a sixth embodiment. In FIG. 16 the structure is unique in that it leaves paths for a portion of the light of each lase point to be directed to another laser next to it in order to keep the lasing in phase. In this example the laser 161 has some of its outer mode structure reflected 162 down to the laser aperture next to it 163 which produces light in phase with 162. The laser which is in phase is 164 and in turn reflects from an angled reflective surface 165 back to the aperture of the laser next to it 167 which is also in phase with 164 and 161 and so on. An angular and or reflective area 164 just outside of the lens or output area can divert a small portion of the light which is overflowing from the lens or output diameter to the lasing grid adjacent to it, enabling a coherent lasing grid. Some of the light from the neighboring lasing points is injected into the lasing point which sets up the lasing points in a phase relation with each other. This allows a coherent operation of all lasing points when the structure directs some of the light from each laser to its neighbor. The reflectance, distance and angles are very precisely calculated by one skilled in the art of optical modeling. Coherent operation is a benefit which has eluded laser array operation for many years. FIG. 16 shows:

161 Large aperture laser with wide divergence only emitting a portion of the light 162 A portion of the light from laser 161 is reflected to aperture 163

163 Aperture of laser where reflectance conforms to the phase of the light from 162

164 Large aperture laser with wide divergence only emitting a portion of the light 165 Angled reflective surface on the back of the laser chip just outside the output aperture 166 the reflected beam in phase with laser grid 164

167 Large aperture laser with wide divergence only emitting a portion of the light Embodiment 7

Figure 17:
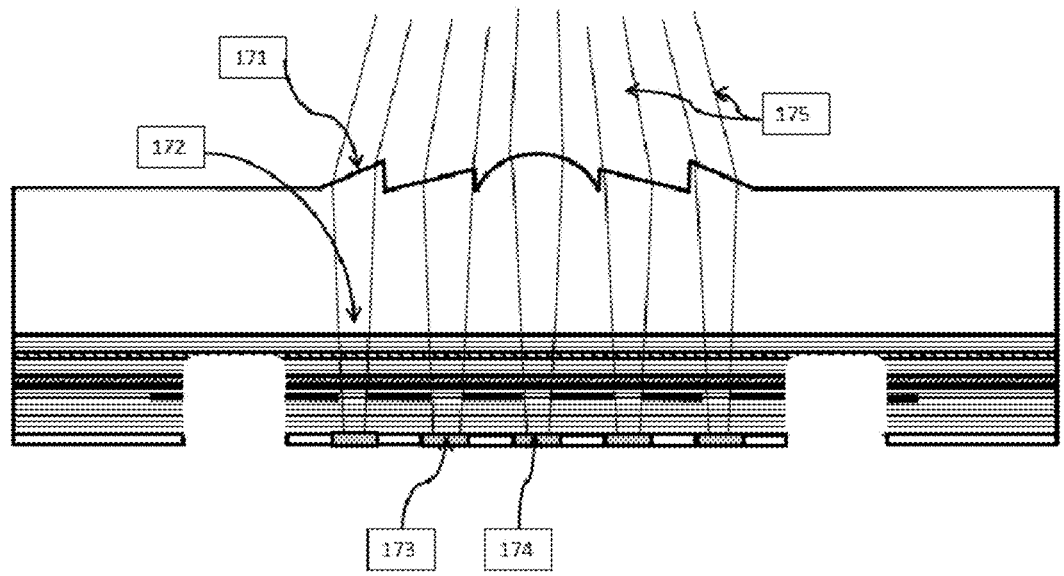
FIG. 17 shows a view of an example embodiment that employs diffractive optical elements.

FIG. 17 shows a seventh embodiment. In FIG. 17, the back side of the lasing grid chip has etched patterns to redirect the laser light 172 to particularly beneficial areas. This is accomplished by diffractive optical elements (DOE) 171, which have the surface etched in a way that when light travels through that portion, the angle of the surface and redirects 175 beams or light depending on the angle of the surface of the DOE. This can be used to collimate or diverge, direct or homogenize the light. FIG. 17 does not illustrate the electrical waveguide. The mode can be controlled by the aperture sizes and characteristics of the reflective surface 173 and 174. FIG. 17 shows:

171 Redirected Laser Grid Beam from beam 172

172 Laser Grid Beam emitted from apertures

173 Contact and back of mirror for back emitting laser grid

174 Contact and back of mirror for back emitting laser grid

175 Redirected beams from laser grid

Embodiment 8

Figure 18:
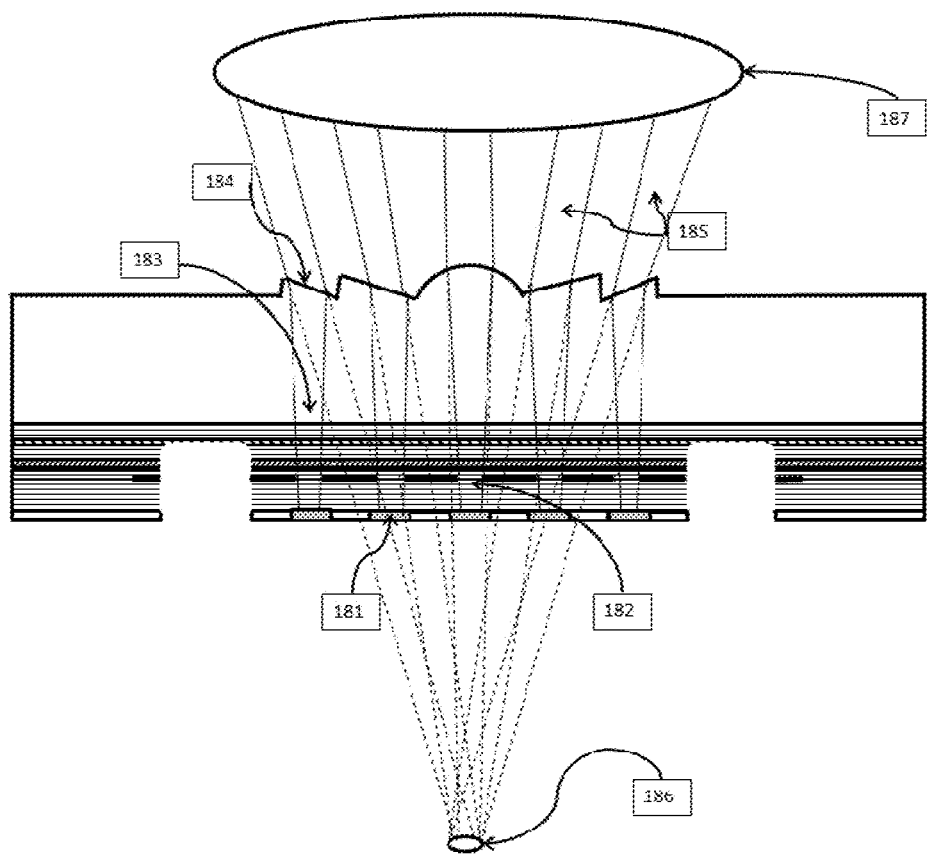
FIG. 18 shows a view of an example embodiment that employs pattern diffractive grating.

FIG. 18 shows an eighth embodiment. In FIG. 18, a patterned diffractive grating 184 (this is the opposite angular pattern than FIG. 17's DOE) is placed or etched over the emission points 181 on the backside of the laser wafer in a back emitting VCSEL design which directs the lasing points outward 185 from the grid. From the lens it looks like all the lasers are coming from a single point 186 behind the chip to form a virtual point source where a macro lens 187 can be used to collimate the beam from the virtual converged source behind the chip. FIG. 18 shows:

- 181 Contact and back of mirror for back emitting laser grid
- 182 Aperture creating laser characteristics
- 183 Laser Beam from laser grid
- 184 Surface of Diffractive Optical Element (DOE) angled for specific total beam grid characteristics
- 185 Redirected beams from laser grid
- 186 Converged virtual light source from all beams as seen from lens 187
- 187 macro lens with focal point on virtual convergence point 186

Embodiment 9

Figure 19:
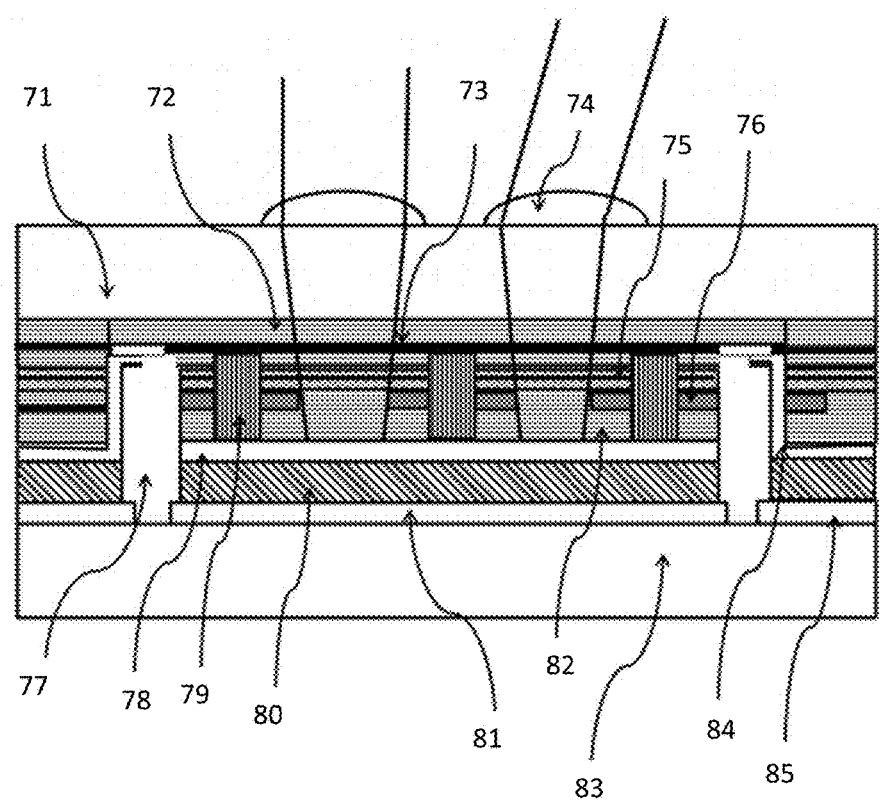
FIG. 19 shows a view of an example microlens embodiment.

FIG. 19 shows a ninth embodiment. FIG. 19 illustrates a cross section of the bonded etched and oxidized Embodiment 3, except it has microlens which have been processed on the back of the laser chip and positioned so that one is aligned to the other and one is slightly misaligned on purpose in order to redirect the laser beam emitted from the single mesa structure. While embodiment 3 is referenced for this arrangement, it should be understood that any of the above back emitting embodiments and a microlens array attached to the chip or positioned above the output grid can be used. The microlens array can have values related to the pitch of the light conducting grid points but with a slightly different pitch lens 74 forcing the light emitted by the lasing points to be directed to a single area where the beams come together or seem like they come together in front of the chip or behind the chip as in a virtual point source. If the microlens pitch is smaller than the laser pitch, it will guide the outlying lasers to a point in front of the chip or directed inward. If the microlens arrays pitch is larger than the lasers' grids' pitch, the light will be directed outward as in FIG. 19. FIG. 19 shows:

- 71 Laser Substrate
- 72 N Mirror
- 73 N Contact Region
- 74 MicroLens slightly offset from laser directing laser light outward
- 75 Active region or quantum wells
- 76 Oxidized layers creating current confinement into the active area
- 77 Etched trench creating isolation from the single ground structure and the active single mesa structure
- 78 P Metal Contact
- 79 Hole Etched into the single mesa structure to allow oxidation to occur
- 80 solder electrically connecting the laser chip and the High speed electrical waveguide
- 81 Signal pad of the GSG electrical waveguide
- 82 P mirror
- 83 GSG Waveguide substrate
- 84 Plating shorting the N metal located on the N contact layer and the single ground mesa which is in electrical contact to the Ground Pad of the GSG electrical waveguide
- 85 Ground Pad of the GSG electrical waveguide

Embodiment 10

Figure 20:
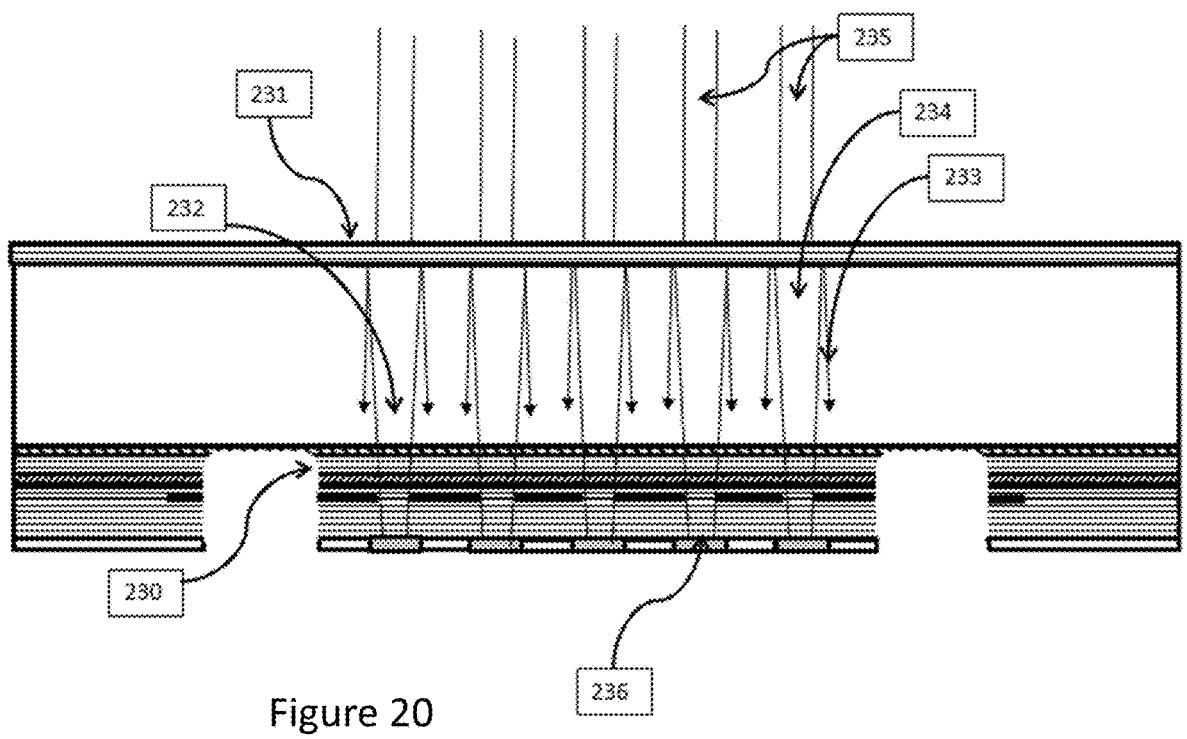
FIG. 20 shows a view of an example tenth embodiment.

FIG. 20 shows a tenth embodiment. FIG. 20 illustrates that an extended cavity laser design can be implemented using the single grid structure by reducing the reflectivity of the N epitaxial output mirror 230 to a point where it will not lase, then adding the reflectivity to a reflective surface 231 on the back of the lasing grid which extends the cavity. This structure reduces feedback of the higher mode structure 233 in the cavity, thereby forming a more fundamental mode structure for the output beam 235 from the grid. FIG. 20 shows:

- 230 Arrow pointing to incomplete N output mirror epitaxial region.
- 231 Reflective region made of dielectrically layers with varying indexes of refraction.
- 232 Cavity of laser beam now includes laser wafer material extending the cavity for modal rejection.
- 233 Reflected higher order modes which are not reflected back into the cavity
- 234 Single or lower order modes in the cavity
- 235 single or lower order modes outputted from the Extended Cavity Device

Embodiment 11

Figure 21:
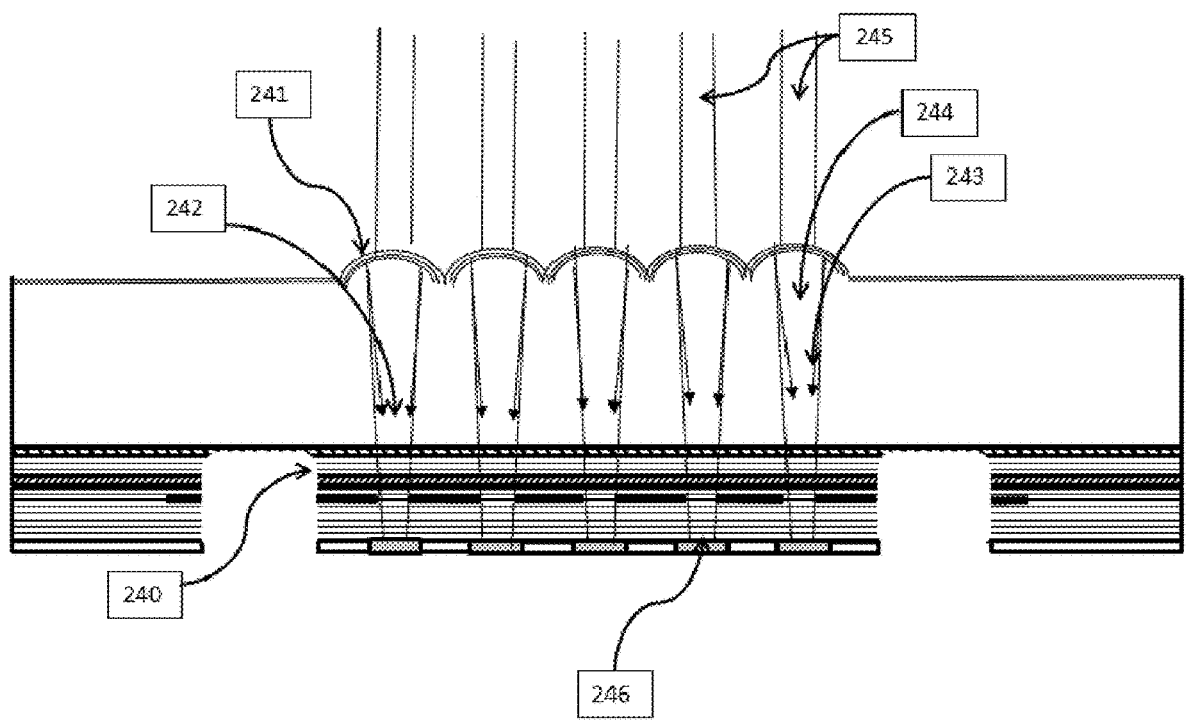
FIG. 21 shows a view of an example eleventh embodiment.

FIG. 21 shows an eleventh embodiment. In FIG. 21, a VCSEL structure can be adapted to the laser grid design like the above embodiment, and the back of the lasing chip where the output reflector (deposited on top of lens shape 241) of the lasing grid emits light can have convex 241 or concave features under the reflector to form better a focused (focus arrows 243) feedback mechanism which rejects high modes and can be designed to have a single mode lasing output 245 from each grid area. The overall lasing structure will then have low M2 values. A lens or microlens can be added to collimate the output. FIG. 21 shows:

- 240 Arrow pointing to incomplete N output mirror epitaxial region.
- 241 Reflective region made of dielectrically layers with varying indexes of refraction deposited on top of microlens structure etched into the laser substrate or wafer
- 242 Single mode beam being reflected within the extended cavity
- 243 light from edges being directed back into the single mode cavity from the optical element on the surface of the chip
- 244 single mode beam has more power and is more selective of the single mode than FIG. 20's single mode beam
- 245 Output of high quality single mode beams
- 246 highly reflective epitaxial mirror

Embodiment 12

Figure 22:
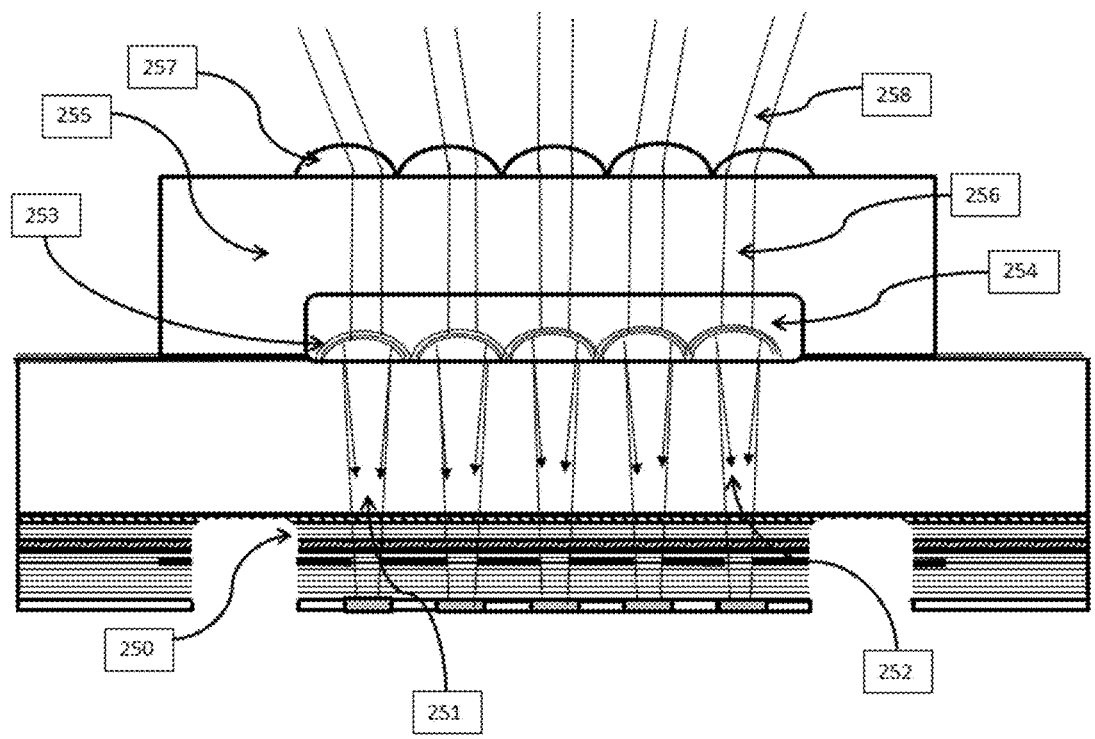
FIG. 22 shows a view of an example twelfth embodiment.

FIG. 22 shows a twelfth embodiment. In FIG. 22, a VCSEL structure can be adapted to the laser grid design like the above embodiment except that the beams which exit straight out of the lens go through an external microlens array which has been designed with different pitch microlens than the laser pitches to allow redirection of the beams either to or from a single location like many of the above embodiments. Other forms of this technique could use a concave lens formed on the bottom of the external lens array which are aligned and have the same pitch as the laser grid, while a convex laser array with a different pitch than the laser grid is at the top. Another technique to direct beams would be to use DOEs as the top optical element instead of the convex microlens which are on the top of the external lens array. 252 is light reflected back into the center of the aperture making a stronger single mode beam while 253 has the reflective coatings which complete the laser output mirror cavity. 254 is the cavity and would have an antireflective coating deposited on the inside of the external lens cavity while also depositing an anti-reflective coating on the top microlens array. Another technique would be to use the flat reflective properties such as in FIG. 20 to complete the cavity mirror and have the microlens array offset on the top or a DOE on top to redirect the beams. FIG. 22 shows:

250 Arrow pointing to incomplete N output mirror epitaxial region.

251 Single mode beam being reflected within the extended cavity

252 light from edges being directed back into the center creating strong single mode cavity from the optical element on the surface of the chip

253 Reflective region made of dielectrically layers with varying indexes of refraction deposited on top of microlens structure etched into the laser substrate or wafer

254 Cavity for etched lens to not touch external lens array

255 External lens array transmissive material

256 Single Mode beam outputted by extended cavity laser

257 Microlens from lens array with different pitch than laser pitch directing beams

258 Directed single mode beam

While the present invention has been described above in relation to example embodiments, various modifications may be made thereto that still fall within the invention's scope, as would be recognized by those of ordinary skill in the art. Such modifications to the invention will be recognizable upon review of the teachings herein. As such, the full scope of the present invention is to be defined solely by the appended claims and their legal equivalents.

What is claimed is:

1. A multi-laser semiconductor apparatus comprising:
an electrical waveguide;
an active mesa structure, wherein the active mesa structure comprises a single mesa having a plurality of semiconductor laser regions within the single mesa, each semiconductor laser region of the single mesa being electrically isolated within the single mesa relative to the other semiconductor laser regions of the single mesa;
a substrate;
a contact layer that extends beneath the active mesa structure and is positioned above the substrate; and
a structure separated from the active mesa structure, wherein the structure provides a contact that shorts the structure to the contact layer to provide a path for a current flow from the electrical waveguide to deliver energy to the semiconductor laser regions;
wherein the electrical waveguide is configured to provide the current flow to the semiconductor laser regions and the structure via a plurality of electrical waveguide contacts, the electrical waveguide contacts comprising a first contact for electrical connection with the semiconductor laser regions and a second contact for electrical connection with the structure contact; and
wherein the contact layer is adapted to carry a current load from the electrical waveguide and spread current laterally through the contact layer to the active mesa structure including interior semiconductor laser region portions of the single mesa for injecting the semiconductor laser regions with current to produce lasing from the semiconductor laser regions.

2. The apparatus of claim 1 wherein the active mesa structure, the structure, the contact layer, and the substrate are part of a laser array, and wherein the first and second contacts of the electrical waveguide connect to a single side of the laser array.

3. The apparatus of claim 2 wherein the laser array is a back emitting laser array.

4. The apparatus of claim 2 wherein the laser array is arranged as an emitter for a light detection and ranging (LiDaR) system.

5. The apparatus of claim 4 wherein the laser array further provides optical communication via the lasing produced from the semiconductor laser regions.

6. The apparatus of claim 2 wherein the laser array further comprises a plurality of diffractive optical elements (DOEs), the DOEs adapted to collimate, diverge, direct, or homogenize light produced by the semiconductor laser regions.

7. The apparatus of claim 1 wherein the contact layer has a thickness sufficient to carry the current load from the electrical waveguide and spread current laterally through the contact layer to the active mesa structure including interior semiconductor laser region portions of the single mesa for injecting the semiconductor laser regions with current to produce lasing from the semiconductor laser regions.

8. The apparatus of claim 1 wherein the contact layer comprises an N contact layer, and wherein the apparatus further comprises:
a P contact layer on top of the active mesa structure, and wherein the first contact of the electrical waveguide is in electrical connection with the P contact layer.

9. The apparatus of claim 1 wherein the structure is arranged as a ground structure for the apparatus.

10. The apparatus of claim 1 wherein the electrical waveguide comprises a ground-signal-ground (GSG) electrical waveguide.

11. The apparatus of claim 1 wherein the electrical waveguide comprises a microstrip or strip line electrical waveguide.

12. The apparatus of claim 1 wherein the active mesa structure is arranged as a vertical cavity surface emitting laser (VCSEL) or a vertical extended cavity surface emitting laser (VECSEL).

13. The apparatus of claim 1 further comprising:
a conductive frame around the active mesa structure that shorts the electrical waveguide second contact to the contact layer.

14. The apparatus of claim 1 wherein a trench separates the active mesa structure from the structure.

15. The apparatus of claim 14 wherein the structure is around a periphery of the active mesa structure.

16. The apparatus of claim 1 wherein the semiconductor laser regions are arranged in a grid pattern, a honeycomb pattern, or a circle pattern on the single mesa.

17. The apparatus of claim 1 further comprising a plurality of active mesa structures, wherein each active mesa structure comprises a single mesa, wherein each of the single mesas comprises a plurality of laser regions within that single mesa, each semiconductor laser region of that single mesa being electrically isolated within that single mesa relative to the other semiconductor laser regions of that single mesa.

18. The apparatus of claim 1 wherein the semiconductor laser regions are electrically isolated from each other within the single mesa via oxidation layers or ion implantation.

19. A multi-laser semiconductor apparatus comprising:
an electrical waveguide;
an active mesa structure, wherein the active mesa structure comprises a plurality of semiconductor laser regions within the active mesa structure itself, each semiconductor laser region of the active mesa structure being electrically isolated within the active mesa structure itself relative to the other semiconductor laser regions of the active mesa structure;
a substrate;
a contact layer that extends beneath the active mesa structure and is positioned above the substrate; and
a structure separated from the active mesa structure, wherein the structure provides a contact that shorts the structure to the contact layer to provide a path for a current flow from the electrical waveguide to deliver energy to the semiconductor laser regions;
wherein the electrical waveguide is configured to provide the current flow to the semiconductor laser regions and the structure via a plurality of electrical waveguide contacts, the electrical waveguide contacts comprising a first contact for electrical connection with the semiconductor laser regions and a second contact for electrical connection with the structure contact;
wherein the contact layer is adapted to carry a current load from the electrical waveguide and spread current laterally through the contact layer to the active mesa structure including interior semiconductor laser region portions of the active mesa structure for injecting the semiconductor laser regions with current to produce lasing from the semiconductor laser regions; and
wherein the active mesa structure further comprises a plurality of holes extending therethrough, each hole having a layer of oxidation around it, the holes and the oxidation layers being positioned to define and electrically isolate the semiconductor laser regions.

20. A multi-laser semiconductor apparatus comprising:
an electrical waveguide;
an active mesa structure, wherein the active mesa structure comprises a plurality of semiconductor laser regions within the active mesa structure itself, each semiconductor laser region of the active mesa structure being electrically isolated within the active mesa structure itself relative to the other semiconductor laser regions of the active mesa structure;
a substrate;
a contact layer that extends beneath the active mesa structure and is positioned above the substrate; and
a structure separated from the active mesa structure, wherein the structure provides a contact that shorts the structure to the contact layer to provide a path for a current flow from the electrical waveguide to deliver energy to the semiconductor laser regions;
wherein the electrical waveguide is configured to provide the current flow to the semiconductor laser regions and the structure via a plurality of electrical waveguide contacts, the electrical waveguide contacts comprising a first contact for electrical connection with the semiconductor laser regions and a second contact for electrical connection with the structure contact;
wherein the contact layer is adapted to carry a current load from the electrical waveguide and spread current laterally through the contact layer to the active mesa structure including interior semiconductor laser region portions of the active mesa structure for injecting the semiconductor laser regions with current to produce lasing from the semiconductor laser regions; and
wherein the active mesa structure further comprises a plurality of conductive regions formed by ion implantation, the ion implantation being positioned to define and electrically isolate the semiconductor laser regions.

* * * * *